United States Patent
Jang et al.

(10) Patent No.: US 7,561,745 B2
(45) Date of Patent: Jul. 14, 2009

(54) METHOD AND SYSTEM FOR GENERATING INPUT FILE USING META REPRESENTATION ON COMPRESSION OF GRAPHICS DATA, AND ANIMATION FRAMEWORK EXTENSION (AFX) CODING METHOD AND APPARATUS

(75) Inventors: Gyeong-ja Jang, Gyeonggi-do (KR); Do-kyoon Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 142 days.

(21) Appl. No.: 11/001,117

(22) Filed: Dec. 2, 2004

(65) Prior Publication Data
US 2005/0131930 A1    Jun. 16, 2005

Related U.S. Application Data

(60) Provisional application No. 60/526,075, filed on Dec. 2, 2003, provisional application No. 60/526,295, filed on Dec. 3, 2003.

(30) Foreign Application Priority Data
Jun. 26, 2004    (KR) ...................... 10-2004-0048663

(51) Int. Cl.
*G06K 9/36* (2006.01)
*G06K 9/46* (2006.01)
*G06T 17/20* (2006.01)
*G06T 15/70* (2006.01)
*G06T 13/00* (2006.01)
*G06F 7/00* (2006.01)

(52) U.S. Cl. .................... 382/232; 382/236; 345/419; 345/473; 707/101

(58) Field of Classification Search .............. 345/419, 345/473; 382/232, 236; 707/101
See application file for complete search history.

(56) References Cited

U.S. PATENT DOCUMENTS 5,912,676 A * 6/1999 Malladi et al. .............. 345/531

(Continued)

OTHER PUBLICATIONS

Mikael Bourges-Sevenier (Mindego) et al, "FDAM of ISO/IEC 14496-1 I/AMD1", MPEG-4 Systems, International Organisation for Standardisation, ISO/IEC JTC1/SC29/WG11, N5480, Coding of Pictures and Audio, 2002, pp. 1-157, Awaji, Saudi Arabia.*

(Continued)

*Primary Examiner*—Kee M Tung
*Assistant Examiner*—Roberta Prendergast
(74) *Attorney, Agent, or Firm*—Buchanan Ingersoll & Rooney PC

(57) ABSTRACT

Provided are a method and system for generating an input file using meta representation of compression of graphics data, and an animation framework extensions (AFX) encoding method and apparatus. The method of generating an input file includes preparing an extensible MPEG-4 textual (XMT) schema that defines a compression node, encoding parameters, and BitWrapperEncodingHints; preparing an XMT2BIFS style sheet that supports conversion of an input XMT file into a scene file according to the XMT schema, and an XMT2MUX style sheet that supports conversion of the input XMT file into a mux file according to the XMT schema; generating the scene file and the mux file by parsing the input XMT file according to the XMT schema using the XMT2BIFS and XMT2MUX style sheets; determining whether the scene file contains uncompressed graphics data; and compressing the graphics data into a bitstream using the encoding parameters and generating a modified scene file and a modified mux file, when uncompressed graphics data is present in the scene file. Accordingly, it is possible to allow an author to easily express or compress three-dimensional (3D) graphics data using meta representation during authoring of 3D contents and generate an input file that can be input to an MPEG-4 encoder. Therefore, it is possible to visualize 3D graphics data or animation data in real time even at a low network bandwidth.

45 Claims, 9 Drawing Sheets

U.S. PATENT DOCUMENTS

| | | | | |
|---|---|---|---|---|
| 6,044,397 | A * | 3/2000 | Eleftheriadis et al. | 725/139 |
| 6,185,602 | B1 * | 2/2001 | Bayrakeri | 709/204 |
| 6,195,088 | B1 * | 2/2001 | Signes | 715/500.1 |
| 6,557,041 | B2 * | 4/2003 | Mallart | 709/231 |
| 6,593,936 | B1 * | 7/2003 | Huang et al. | 345/619 |
| 6,631,403 | B1 * | 10/2003 | Deutsch et al. | 709/217 |
| 6,654,931 | B1 * | 11/2003 | Haskell et al. | 715/500.1 |
| 6,693,645 | B2 * | 2/2004 | Bourges-Sevenier | 345/619 |
| 6,751,623 | B1 * | 6/2004 | Basso et al. | 707/101 |
| 6,833,840 | B2 * | 12/2004 | Lifshitz | 345/619 |
| 6,996,571 | B2 * | 2/2006 | McConnell | 707/101 |
| 7,016,906 | B1 * | 3/2006 | Janzig et al. | 707/101 |
| 7,149,770 | B1 * | 12/2006 | Kalva et al. | 709/203 |
| 2001/0010706 | A1 * | 8/2001 | Sato et al. | 375/240.12 |
| 2002/0009151 | A1 * | 1/2002 | Gentric | 375/240.26 |
| 2002/0071654 | A1 * | 6/2002 | Notoya et al. | 386/65 |
| 2002/0083032 | A1 * | 6/2002 | Bourges-Sevenier | 707/1 |
| 2002/0085028 | A1 * | 7/2002 | Tabatabai et al. | 345/748 |
| 2003/0031260 | A1 * | 2/2003 | Tabatabai et al. | 375/240.25 |
| 2003/0103073 | A1 * | 6/2003 | Yokoyama | 345/716 |
| 2003/0110297 | A1 * | 6/2003 | Tabatabai et al. | 709/246 |
| 2004/0109502 | A1 * | 6/2004 | Luken | 375/240.08 |
| 2004/0111677 | A1 * | 6/2004 | Luken et al. | 715/523 |

OTHER PUBLICATIONS

Michelle Kim et al., "Study Text of ISO/IEC 14496-1:20011FDAM2", MPEG-4 Systems, Mar. 2002, pp. 1-91.*

ISO/IEC, "Information Technology—Coding of Audio-Visual Objects", Part 1 : Systems, WD3.0 ISO/IEC 14496-1, MPEG-4, 3rd Edition, Aug. 2002, N5065.*

Cheong et al., "Development of an interactive contents authoring system for MPEG-4", Proceedings of Workshop and Exhibition on MPEG-4, Jun. 18-20, 2001, pp. 17-20.*

Hunter, J., "An overview of the MPEG-7 description definition language (DDL)", IEEE Transactions on Circuits and Systems for Video Technology, vol. 11, Issue 6, Jun. 2001, pp. 765-772.*

Kim, T. and Fishwick, P. A., "A 3D XML-based customized framework for dynamic models", Proc. of Seventh international Conference on 3D Web Technology, Feb. 2002, ACM Press, New York, NY, 103-109.*

Kwang-Yong Kim et al., "Design and implementation of MPEG-4 authoring tool", Proc. of Fourth Annual Conference on Computational Intelligence and Multimedia Applications, ICCIMA 2001, Oct. 30-Nov. 1, 2001, pp. 348-351.*

Mukherjee et al., "U-P2P: a peer-to-peer system for description and discovery of resource-sharing communities", Proc. of 22nd International Conference on Distributed Computing Systems Workshops, 2002, pp. 1-5.*

Puri et al., "MPEG-4: an object-based multimedia coding standard supporting mobile applications", The Journel of Mob. Netw. Appl. vol. 3, No. 1 (Jun. 1998), pp. 5-32.*

Widener et al., "Open metadata formats: efficient XML-based communication for heterogeneous distributed systems", 21st International Conference on Distributed Computing Systems, Apr. 16-19, 2001, pp. 739-742.*

C. Herpel and A. Eleftheriadis, "MPEG-4 Systems: Elementary Stream Management," Signal Processing: Image Communication, Tutorial Issue on the MPEG-4 Standard, vol. 15, Nos. 4-5, Jan. 2000, pp. 299-320. http://www.ee.columbia.edu/~eleft/mmsp/papers/icj00-ch.pdf.*

Kyuhoen Kim et al., "Interactive Contents Authoring System based on XMTand BIFS", International Conference On Multimedia, Dec. 1, 2002, pp. 275-278.*

Michelle Kim et al., "Extensible MPEG-4 Textual Format (XMT)", International Multimedia Conference, NY,NY; vol. Conf. 8; Nov. 4, 2000, pp. 71-74.*

M. Bourges-Sévenier, E. S. Jang, and J. D. K. Kim, "Animation framework for MPEG-4 systems," in Proc. ICME New York, 2000.*

Bourges-Sevenier, M.; "An introduction to MPEG-4 animation framework extension (AFX)", Proceedings. 2002 International Conference on Image Processing, vol. 3, Jun. 24-28, 2002, pp. 1-4, vol. 3.*

Joung, Y. and Kim, K. 2002. An XMT API for generation of the MPEG-4 scene description. In Proceedings of the Tenth ACM international Conference on Multimedia (Juan-les-Pins, France, Dec. 1-6, 2002). Multimedia '02. ACM, New York, NY, 307-310.*

Kalva, H., et al., "Implementing multiplexing, streaming, and server interaction for MPEG-4", IEEE Transactions on Circuits and Systems for Video Technology, vol. 9, Issue 8, Dec. 1999, pp. 1299-1311.*

Isenburg, M. and Snoeyink, J. 2003. Binary compression rates for ASCII formats. In Proceedings of the Eighth international Conference on 3D Web Technology (Saint Malo, France, Mar. 9-12, 2003). Web3D '03. ACM, New York, NY, 173-ff.*

Joung et al., "XMT tools for interactive broadcasting contents description", Proceedings Third International Workshop on Digital and Computational Video, DCV 2002, Nov. 14-15, 2002, pp. 184-191.*

Martínez, J. M., Rubio, L. F., and Morán, F. 2002. Authoring 744: first results. In Proceedings of the Tenth ACM international Conference on Multimedia (Juan-les-Pins, France, Dec. 1-6, 2002). Multimedia '02. ACM, New York, NY, 203-206.*

Schmitz, P. 2002. Multimedia meets computer graphics in SMIL2.0: a time model for the web. In Proceedings of the 11th international Conference on World Wide Web (Honolulu, Hawaii, USA, May 7-11, 2002). WWW '02. ACM, New York, NY, 45-53.*

Gyeong Ja Jang et al., "The XMT-A Specifications for BitWrapper node and its encoding Parameters" ISO/IEC JTC1/SC29/WG11 M10352, Dec. 4, 2003, pp. 1-26, XP-002439776, Hawaii, USA.

Injae Lee et al., "Design and Implementation of XMT-A to/from MP4 Converter for Authoring and Retrieving MPEG-4/7 Based Interactive Contents" Advanced Communication Technology, 2004. The 6th International Conference on Phoenix Park, Korea, Feb. 9-11, 2004, vol. 2, pp. 636-639, XP-010702631.

Gyeong Ja Jang et al., "The Specifications for XMT-A Compliant BitWrapper node and the encoding Parameters used in its Bitstream" ISO/IEC JTC1/SC29/WG11 M10114, Oct. 15, 2003, pp. 1-19, XP-002439777, Brisbane, Australia.

Kyuheon Kim et al., "Interactive Contents Authoring System based on XMT and BIFS" Online, Dec. 6 2002, pp. 275-278, XP-002439778.

Kwang-Yong Kim et al., "Design and Implementation of MPEG-4 Authoring Tool" Online, 2001, pp. 1-4, XP-002439779.

Amielh M et al., "Bitstream Syntax Description Language: Application of XML-Schema to Multimedia Content Adaptation" Proceedings of the International Conference on World Wide Web, May 8, 2002, pp. 1-14. XP-002255244.

Bourges-Sevenier M., "An Introduction to MPEG-4 Animation Framework Extension (AFX)" Proceedings 2002 International Conference on Image Processing. ICIP 2002. Rochester, NY, Sep. 22-25, 2002, International Conference on Image Processing, New York, NY, vol. 2 of 3, Sep. 22, 2002, pp. 1-4, XP-010607495.

European Search Report Application No./Patent No. 04257500.1-1247 dated Aug. 13, 2007.

* cited by examiner

METHOD AND SYSTEM FOR GENERATING INPUT FILE USING META REPRESENTATION ON COMPRESSION OF GRAPHICS DATA, AND ANIMATION FRAMEWORK EXTENSION (AFX) CODING METHOD AND APPARATUS

This application claims the priorities of U.S. Provisional Application No. 60/526,075, filed on Dec. 2, 2003, and U.S. Provisional Application No. 60/526,295, filed on Dec. 3, 2003, in the USPTO, and Korean Patent Application No. 2004-48663, filed on Jun. 26, 2004, in the Korean Intellectual Property Office, the disclosures of which are incorporated herein in their entirety by reference.

BACKGROUND OF THE INVENTION

1. Field of the Invention

The present invention relates to the field of graphics data writing, and more particularly, to a method and system for generating an input file using meta representation of graphics data compression, and an Animation Framework eXtensions (AFX) encoding method and apparatus.

2. Description of the Related Art

A conventional extensible MPEG-4 Textual format (hereinafter referred to as 'XMT') technique enables an author to easily and conveniently process MPEG-4 primitives, e.g., two-dimensional (2D) or three-dimensional (3D) graphics, audio, and video. The XMT technique provides a framework for contents authoring that allows data made by an author to be reused in various applications and have compatibility and portability. The reuse of data and data compatibility and portability can be realized because extensible Markup Language (XML) syntax related to MPEG-4 primitives is defined in the conventional XMT.

However, since the conventional XMT does not treat compression of 3D data, it is difficult to compress animation data and representation data related to 3D contents authored by an author. In other words, an XMT file containing 3D graphics data cannot be parsed by an XMT parser, and thus, it is impossible to make an input file that can be input to a Binary Format of Scene (BIFS) encoding unit and an MP4 encoding unit. Accordingly, it is impossible to make an output mp4 file of the BIFS encoding unit and the MP4 encoding unit.

SUMMARY OF THE INVENTION

The present invention provides a method and system for generating an input file using meta representation of graphics data compression by defining representation of data compression proposed by MPEG-4 Animation Framework eXtensions (AFX) using the XMT, so as to easily compress graphics data during an authoring process.

The present invention also provides an AFX encoding apparatus and method for generating an input file that can be input to a BIFS encoding unit and an MP4 encoding unit by compressing a scene file and a mux file obtained from an XMT file containing the original data that is not compressed.

According to one aspect of the present invention, there is provided a system for making an input file using meta representation of compression of graphics data, the system including an extensible MPEG-4 textual format (XMT) schema defining a compression node that specifies graphics object data that will be compressed, encoding parameters available for compressing the graphics object data, BitWrapperEncodingHints that specifies a compression bitstream format, and AFXConfig that specifies the type of a decoder for decoding a transmitted bitstream; an XMT2BIFS style sheet supporting conversion of an input XMT file into a scene file according to the XMT schema; an XMT2MUX style sheet supporting conversion of the input XMT file into a mux file according to the XMT schema; an XMT parser making the scene file and the mux file by parsing the input XMT file according to the XMT schema using the XMT2BIFS and XMT2MUX style sheets; a compression determination unit determining whether the scene file obtained by the parsing of the XMT parser contains uncompressed graphics object data; and an animation framework extensions (AFX) encoder compressing the graphics object data into a bitstream and generating a modified scene file and a modified mux file when the compression determination unit determines that the graphics object data is not compressed, using the encoding parameters in the scene file.

According to another aspect of the present invention, there is provided a method of making an input file using meta representation of compression of graphics data, the method including (a) preparing an extensible MPEG-4 textual format (XMT) schema, wherein the XMT schema defines a compression node (BitWrapper node) containing information regarding the object data that is to be compressed; encoding parameters for compressing the object data; BitWrapperEncodingHints including a format of a compressed bitstream; and AFXConfig specifying the type of decoders available for decoding a transmitted bitstream; (b) preparing an XMT2BIFS style sheet supporting conversion of an input XMT file into a scene file according to the XMT schema, and an XMT2MUX style sheet supporting conversion of the input XMT file into a mux file according to the XMT schema; (c) making a scene file and a mux file by parsing the input XMT file according to the XMT schema using the XMT2BIFS and XMT2MUX style sheets; (d) determining whether the scene file obtained as the result of parsing contains uncompressed graphics object data; and (e) when it is determined that the uncompressed graphics object data is present, the uncompressed graphics object data is compressed into a compressed bitstream and a modified scene file and a modified mux file are generated, using encoding parameters included in the scene.

The compression node may include a node field containing object data that is to be compressed; a buffer field which is not compatible with an URL field and transmits a compressed bitstream in the compression node through an in-band; an URL field which is not compatible with the buffer field and transmits the compressed bitstream in the compression node through an out-band; and a type field defining compression method of the object data contained in the node field.

During the transmission of the compressed bitstream through the in-band, the input XMT file containing the compression node is converted into the scene file, the scene file is input to a binary format of scene (BIFS) encoding unit and converted into a bifs file, the compressed bitstream in the node field of the compression node is included in the bifs file, and the bifs file is transmitted. During the transmission of the compressed bitstream through the out-band, the input XMT file which contains the compression node is converted into the scene file, the scene file is input to the BIFS encoding unit and converted into the bifs file, the compressed bitstream in the node field of the compression node is transmitted separately from the bifs file.

In order to compress object data included in a node field of the compression node, the encoding parameters may comprise at least one of a group of parameters related to keyframe animation data of coordinates of a fixed point of an object whose data is to be compressed, a group of parameters related to three-dimensional mesh information, a group of parameters related to rotation keyframe animation data, a group of parameters being related to motion keyframe animation data. The BitWrapperEncodingHints may be included in an objectDescriptor with binary identification that is equivalent to URL identification defined in the URL field in the compression node, and further specifies a name of a file storing the compressed bitstream and the type of format in which the compressed bitstream is compressed. The AFXConfig may further comprise information regarding the type of a decoder available for decoding the compressed bitstream of the object data in the node field that is compressed in the compression node by an AFX encoding unit and transmitted to the URL.

(c) may comprise receiving the input XMT file containing a header having an InitialObjectDescriptor and a body having at least one compression node; making the scene file and the mux file by parsing the input XMT file according to the XMT schema using the XMT2BIFS and XMT2MUX style sheets. The InitialObjectDescriptor of the header comprises StreamSource defining a name of a file output from the BIFS encoding unit; and decoding information regarding decoding of the compressed file from BIFS encoding unit; and synchronization information regarding a time sequence in which graphics objects are displayed. The compression node of the body comprises a node field storing a name of an already compressed node; and a buffer field storing a name of an already compressed object data file. The scene file comprises at least one compression node that is equivalent to the compression node of the body, and the mux file comprises an InitialObjectDescriptor that is equivalent to the InitialObjectDescriptor of the header; and information regarding a stream format of a file which is included in the InitialObjectDescriptor and output from the BIFS encoding unit.

(c) may comprise receiving the input XMT file having a header which includes an InitialObjectDescriptor; and a body which includes at least one compression node and an ObjectDescriptorUpdate with at least one objectDescriptor; and making the scene file and the mux file by parsing the input XMT file according to the XMT schema using the XMT2BIFS and XMT2MUX style sheets. The InitialObjectDescriptor of the header comprises StreamSource defining a name of a file output from the BIFS encoding unit; and decoding information regarding decoding of the compressed file from BIFS encoding unit; and synchronization information regarding a time sequence in which graphics objects are displayed. The compression node of the body comprises URL identification that is equivalent to those of ObjectDescriptor of ObjectDescriptorUpdate including a name of a file storing a bitstream of already compressed object data. The objectDescriptor in the ObjectDescriptorUpdate of the body comprises binary identification, as a field, which is equal to a value of the URL identification of compression node in the body; and AFXConfig being information regarding decoding of the compressed object data; and BitWrapperEncodingHints defining a name of a file storing the bitstream of the compressed object data and type of compression format of the compressed bitstream. The scene file comprises at least one compression node that is equivalent to those of the body; and an ObjectDescriptorUpdate that has ObjectDescriptor contatining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file comprises an InitialObjectDescriptor; and an objectDescriptor that is equivalent to that of ObjectDescriptorUpdate in the body.

(c) may comprise receiving the input XMT file having a header with an InitialObjectDescriptor and a body with at least one compression node; and making the scene file and the mux file by parsing the input XMT file according to the XMT schema using the XMT2BITS and XMT2MUX style sheets. The InitialObjectDescriptor of the header comprises StreamSource defining a name of a file output from the BIFS encoding unit; decoding information regarding decoding of the compressed file from BIFS encoding unit; and synchronization information regarding a time sequence in which graphics objects are displayed. The compression node of the body comprises a node field storing a name of a node that is to be compressed; object data that is included in the node field and to be compressed; encoding parameters available for compressing the object data; and a buffer field storing a name of a bitstream file of the object data compressed using the encoding parameters. The scene file comprises at least one compression node that is equivalent to the compression node of the body. The mux file comprises an InitialObjectDescriptor that is equivalent to the InitialObjectDescriptor of the header; and information regarding a stream format of a file that is output from the BIFS encoding unit and included in the InitialObjectDescriptor.

(c) may comprise receiving the input XMT file having a header that includes an InitialObjectDescriptor, and a body having at least one compression node and an ObjectDescriptorUpdate with at least one objectDescriptor; and making the scene file and the mux file by parsing the input XMT file according to the XMT schema using the XMT2BIFS and XMT2MUX style sheets. The InitialObjectDescriptor of the header comprises StreamSource defining a name of a file output from the BIFS encoding unit; decoding information regarding decoding of the compressed file from BIFS encoding unit; and Synchronization information regarding a time sequence in which graphics objects are displayed. The compression node of the body comprises a node field storing a name of a node that is to be compressed; object data that is included in the node field and to be compressed; encoding parameters available for compressing the object data; and a field storing URL identification that is equivalent to that of ObjectDescriptor of ObjectDescriptorUpdate including BitWrapperEncodingHints that contatins a name of a file in which the bitstream of the object data compressed using the encoding parameters will be stored. The objectDescriptor included in the ObjectDescriptorUpdate of the body comprises binary identification, as a field, which is equal to a value of the URL identification of compression node in the body; and AFXConfig being information regarding decoding of the compressed object data; and BitWrapperEncodingHints defining a name of a file storing the bitstream of the compressed object data and stream format of the bitstream. The scene file comprises at least one compression node that is equivalent to those of the body; and an ObjectDescriptorUpdate. The mux file comprises an InitialObjectDescriptor and an objectDescriptor that are equivalent to those of ObjectDescriptorUpdate in the body.

(c) may comprise receiving the input XMT file having a header that includes an InitialObjectDescriptor; and a body that includes at least one compression node with a buffer field, at least one compression node with an URL field, and an ObjectDescriptorUpdate with objectDescriptors, the number of which is equal to the number of the compression nodes with the URL field; and making the scene file and the mux file by parsing the input XMT file according to the XMT schema using the XMT2BIFS and XMT2MUX style sheets. The InitialObjectDescriptor of the header comprises StreamSource defining a name of a file output from the BIFS encoding unit;

decoding information regarding decoding of the compressed file from BIFS encoding unit; and synchronization information regarding a time sequence in which graphics objects are displayed. The compression node of the body that has the buffer field comprises a node field storing a name of a node that is to be compressed; object data that is included in the node field and to be compressed; encoding parameters available for compressing the object data; and a buffer field storing a name of a bitstream of the object data compressed using the encoding parameters. The compression node of the body that has the URL field comprises a node field storing a name of a node that is to be compressed, object data that is included in the node field and to be compressed; encoding parameters available for compressing the object data; and a field storing URL identification that is equivalent to those of ObjectDescriptor of ObjectDescriptorUpdate including BitWrapperEncodingHints that contatins a name of a file in which the bitstream of the object data compressed using the encoding parameters will be stored. The objectDescriptor included in the ObjectDescriptorUpdate of the body comprises binary identification, as a field, which corresponds to binary identification of the objectDescriptor of the header and whose value is equal to a value of the URL identification of compression node in the body; and AFXConfig being information regarding decoding of the compressed object data; and BitWrapperEncodingHints defining a name of a file storing the bitstream of the compressed object data and type of compression format of the compressed bitstream. The scene file comprises a compression node that is equivalent to those of the body; and ObjectDescriptorUpdate that has ObjectDescriptor contatining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file comprises InitialObjectDescriptor and objectDescriptor that are equivalent to those of ObjectDescriptorUpdate in the body.

(d) may comprise detecting at least one BitWrapper node from the scene file obtained by the result of parsing; and when graphics object data is included in a node field of the detected compression node, determining that uncompressed data is present. (e) may comprise (e1) when it is determined that the graphics object data contains uncompressed data, compressing object data in compression nodes of the scene file into bitstream by an encoding unit available for compressing the object data, using encoding parameters included in the compression nodes; and (e2) making a modified scene file by deleting the object data and encoding parameters from the respective compression nodes of the scene file, and a modified mux file modified such that a name of a file output from the BIFS encoding unit can reflect a name of the modified scene file.

(e1) may comprise (e11) when it is determined that the graphics object data is not compressed, storing the object data and encoding parameters in the compression node of the scene file; (e12) transmitting the object data and encoding parameters to a predetermined encoding unit that corresponds to the type of the graphics object data in the node field of the compression node containing the stored object data; and (e13) compressing the graphics object data into a bitstream by the predetermined encoding unit using the encoding parameters.

The predetermined encoding unit in (e1) may comprise at least one of a fixed coordinate encoder, a mesh encoder, a rotational data encoder, and a positional data encoder. The fixed coordinate encoder encodes keyframe animation data regarding coordinates of a fixed point of the graphics object data that will be compressed using related parameters, the mesh encoder encodes the three-dimensional mesh information using parameters related to the three-dimensional mesh information, the rotational data encoder encodes rotational key frame animation data using related parameters, and the positional data encoder encodes keyframe animation data using related parameters.

According to yet another aspect of the present invention, there is provided an animation framework extensions (AFX) encoding apparatus comprising an object data storage unit storing the object data; an encoding parameter storage unit storing the encoding parameters; an AFX parser detecting at least one compression node from a scene file that includes a BitWrapper node, and having an object data and an encoding parameters contained in the compression node of the scene file stored in the object data storage unit and the encoding parameter storage unit when a node field of the compression node contains graphics object data; an encoding unit matching the type of the stored object data and compressing the original data in the object data storage unit into a bitstream using the encoding parameters stored in the encoding parameter storage unit; and an input file generator generating a modified scene file by deleting object data and encoding parameters from the respective compression nodes of the scene file and a modified mux file modified such that a name of a file output from a BIFS encoding unit reflects a name of the modified scene file, when the AFX parser determines that the node field of the compression node contains graphics object data.

The encoding unit may comprise at least one of a fixed coordinate encoder, a mesh encoder, a rotational data encoder, and a positional data encoder. The fixed coordinate encoder matches the type of the stored object data and encoding parameters, and encodes keyframe animation data regarding coordinates of a fixed point of object data that will be compressed using related parameters; the mesh encoder matches the type of stored object data and encoding parameters and encodes three-dimensional mesh information using related parameters; the rotational data encoder matches the type of the stored object data and encoding parameters and encodes rotational keyframe animation data using related parameters; and the positional data encoder matches the type of the stored object data and encoding parameters and encodes motion keyframe animation data using related parameters.

According to still another aspect of the present invention, there is provided a an animation framework extensions (AFX) encoding method comprising (a) detecting at least one compression node from a scene file that includes a BitWrapper node; (b) storing a node that contains object data and encoding parameters stored in the detected compression node; (c) compressing the object data into a bitstream by an encoding unit matching the type of the node that contains the object data, using the stored encoding parameters matching the encoder; and (d) generating a modified scene file by deleting object data and encoding parameters from respective compression nodes of the scene file, and a modified mux file modified such that a name of a file output from a BIFS encoding unit reflects a name of the modified scene file.

According to still another aspect of the present invention, there is provided a computer readable recording medium for storing a program that executes a method of any one of claims 1 through 15, 32, and 33 using a computer.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
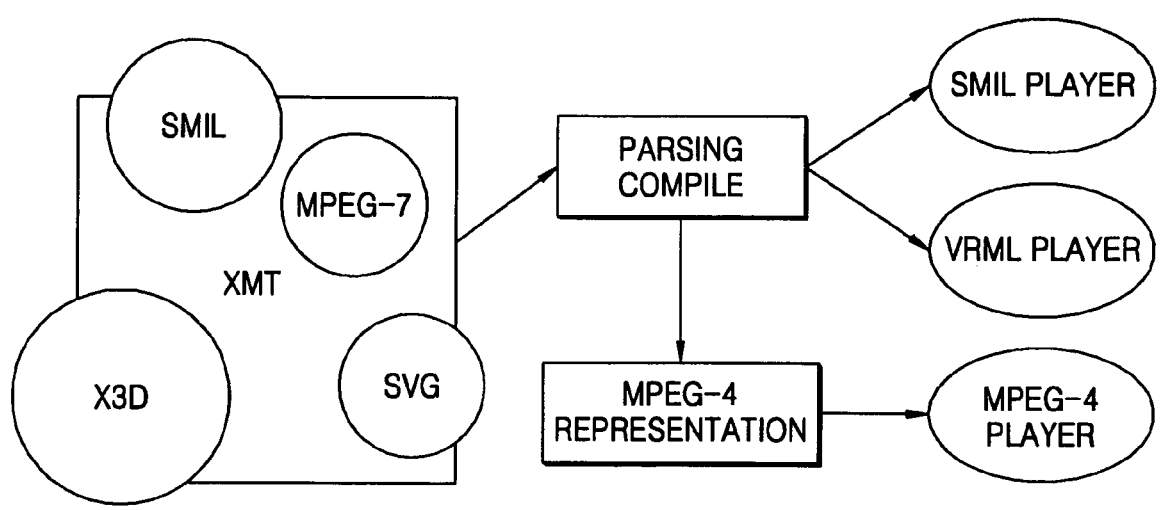
FIG. 1 is an authoring framework that allows generation of contents using textual syntax and a Motion Picture Experts Group (MPEG)-4 node.

An input file generating system that uses meta representation of compression of three-dimensional (3D) graphics data according to the present invention will be in detail described with reference to the accompanying drawings. The same reference numerals represent the same elements throughout the drawings.

A method of controlling factors needed to author, represent, process, and compress 3D contents is required for an author to easily compress 3D data. Such factors can be controlled using the XMT. The XMT is a framework regarding authoring of MPEG-4 contents such as audio, video, two-dimensional (2D) contents, and 3D contents. Also, the XMT is an authoring framework that allows generation of contents in a MPEG-4 node using textual syntax. The framework is illustrated in FIG. 1. The XMT allows content authors, tools, and service providers to reuse contents made by a content author. Also, the XMT enables the contents to be interoperable with an extensible 3D (X3D) and a Synchronized Multimedia Integration Language (SMIL).

As shown in FIG. 1, an XMT is compatible with and can be played by an SMIL player, a Virtual Reality Modeling Language (VRML) player, and an MPEG-4 player. Referring to FIG. 1, the XMT may be parsed and played by the SMIL player, played by the VRML player after preprocessing X3D contents, or played by the MPEG-4 player after compiling representation of MPEG-4 (mp4) format.

The XMT is presented in the dual construction of an XMT-A format and an XMT-Ω format. The XMT-A format is an XML-based version of MPEG-4 contents that is representation of audio, video, 2D or 3D graphics data, or compression thereof, and includes extended 3D graphics (X3D). The XMT-A format further includes an X3D format that is an extension of the XMT-A format to represent MPEG-4 characteristics. A textual format and a binary format are mapped at a ratio of 1:1 in the XMT-A format.

The XMT-Ω format is a high-rank representation of the MPEG-4 characteristics based on the SMIL. The XMT can be default-mapped from the XMT-Ω format into the XMT-A format even if a content author is not familiar with a mechanism from Ω to A. The XMT-Ω format provides interface presentation functions that enable a user to easily and conveniently author contents. In general, MPEG-4 data is presented, processed, and compressed in the XMT-A format.

Accordingly, a compression technique of adjusting factors needed to author, represent, process, and compress 3D graphics data must be defined in the XMT-A format so that an author can compress the 3D graphics data.

In other words, animation data and representation data related to 3D contents made by the author can be compressed since representation of compressed data proposed by the MPEG-4 Animation Framework eXtensions (AFX) is defined in the XMT. Thus, the author can compress 3D graphics data based on this definition and send the result of compression. That is, factors required to compress 3D data such as animation data or representation data are defined with parameters in the XMT. The factors for compression of the 3D data must be defined in an XMT-A schema, using a node that represents compression of the 3D data. Also, the factors for compression of 3D data must be expressed using meta representation and the 3D data must be compressed using the meta representation.

The present invention will now be briefly described. The present invention proposes two methods of generating an input file that can be input to an MPEG-4 encoding unit using meta representation of compression of 3D graphics data. A first one of the methods is to generate an input file input to the MPEG-4 encoding unit when a user uses an input file containing already compressed 3D graphics data. A second one of the methods is to generate an input file input to the MEPG-4 encoding unit when the user uses an input file containing uncompressed 3D graphics data and encoding parameters.

In the first method, when a user desires to compress an input XMT file containing already compressed 3D graphics data, an XMT parser receives the XMT file, parses it according to an XMT schema using style sheets of the 3D graphics data, and generates a scene file and a mux file as a result of parsing. Although the input XMT file is simply divided into the scene file and the mux file during the parsing of the input XMT file, the 3D graphics data in the input XMT file has already been compressed into a compressed bitstream, and thus, the scene and mux files can be input to the MPEG-4 encoding unit.

However, a scene file and a mux file obtained from an XMT file that contains uncompressed 3D graphics data cannot be input to the MPEG-4 encoding unit, since the MPEG-4 encoding unit can read and process an input file made in only a compressed bitstream format. To solve this problem, in the second method, the 3D graphics data is compressed into a bitstream using encoding parameters. Accordingly, the second method further requires a compressor.

Figure 2:
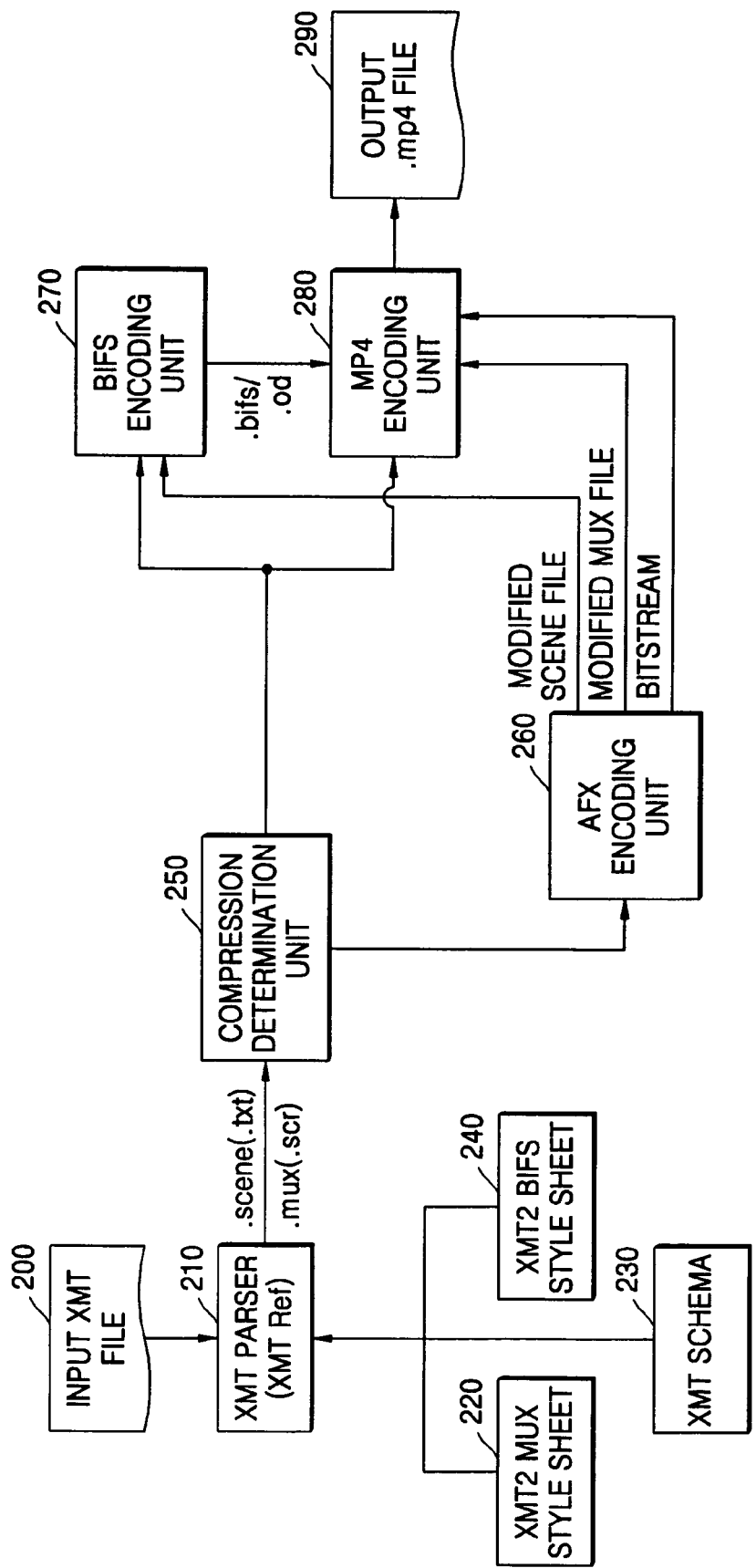
FIG. 2 is a block diagram of an exemplary input file generating system capable of compressing 3D graphics data using meta representation of compression of three-dimensional (3D) graphics data that defines representation of data compression proposed by the MPEG-4 AFX using the XMT.

FIG. 2 is a block diagram of an input file generating system capable of compressing 3D graphics data using meta representation of compression of 3D graphics data that defines representation of data compression suggested by the MPEG-4 AFX using the XMT. Referring to FIG. 2, when a user desires to compress an XMT file 200 containing uncompressed 3D graphics data and encoding parameters, an XMT parser 210 receives the XMT file 200, parses an input keyword using an XMT schema 230 and style sheets 220 and 240 of the 3D graphics data, and generates a scene file and a mux file as the result of parsing. When the scene file and the mux file are input to an AFX encoding unit 260, the AFX encoding unit 260 compresses the uncompressed object data in the scene and mux files into bitstreams and generates input files so that they can be input to a BIFS encoding unit 270 and an MP4 encoding unit 280. When the obtained bitstreams are input to the MP4 encoding unit 280, an ".mp4" bitstream file 290 is output from the MP4 encoding unit 280.

The input file generating system of FIG. 2 includes the XMT schema 230, the XMT2BIFS style sheet 240, the XMT2MUX style sheet 220, the XMT parser 210, a compression determination unit 250, and the AFX encoding unit 260.

The XMT schema 230 defines a compression node that includes information regarding object data that will be compressed, the encoding parameters, BitWrapperEncodingHints that specifies a compressed bitstream format, and AFXConfig that specifies the type of a decoder that decodes a transmitted bitstream.

The compression node includes a node field, a buffer field, a URL field, and a type field that allows selection of a method in which object data included in the node field is to be compressed. The node field contains object data that is to be compressed. The buffer field is not compatible with the URL field and allows transmission of a compressed bitstream defined in the node as an in-band bitstream. The URL field that is not compatible with the buffer field transmits a compressed bitstream contained in the node as an out-band bitstream. During the transmission of the compressed bitstream as the in-band bitstream, an input XMT file containing the compression node is converted into a scene file, and the scene file is input to a BIFS encoding unit and converted into a bifs file. The compressed bitstream in the node field of the compression node is included in the bifs file. During the transmission of the compressed bitstream as the out-band bitstream, the input XMT file containing the compression node is converted into a scene file, and the scene file is input to the BIFS encoding unit and converted into a bifs file. However, in this case, the compressed bitstream in the node field of the compression node is not included in the bifs file but instead is transmitted separately from the bifs file.

The encoding parameters defined in the XMT schema 230 include parameters of at least one of keyframe animation data regarding the coordinates of a fixed point of an object that is to be compressed, 3D mesh information, rotational keyframe animation data, and positional keyframe animation data.

BitWrapperEncodingHints defined in the XMT schema is included in object descriptor with the same binary identification (ID) as a URL ID described by the URL field in the compression node, and further specifies the name of a file of the compressed bitstream and the type of a format in which the bitstream is compressed.

The AFXConfig defined in the XMT schema 230 further includes information, e.g., information regarding the type of a decoder, which is required when the compression node compresses the object data stored in the node field into a bitstream using the AFX encoding unit 260, transmits the bitstream to a URL, and decodes the bitstream.

The XMT2BIFS style sheet 240 supports conversion of the XMT file 200 into a scene file based on the XMT schema 230. The XMT2MUX style sheet 220 supports conversion of the XMT file 200 into a mux file based on the XMT schema 230.

The XMT parser 210 parses the XMT file 200 according to the XMT schema 230, using the XMT2BIFS style sheet 240 and the XMT2MUX style sheet 220, and generates the scene file and the mux file.

Figure 3:
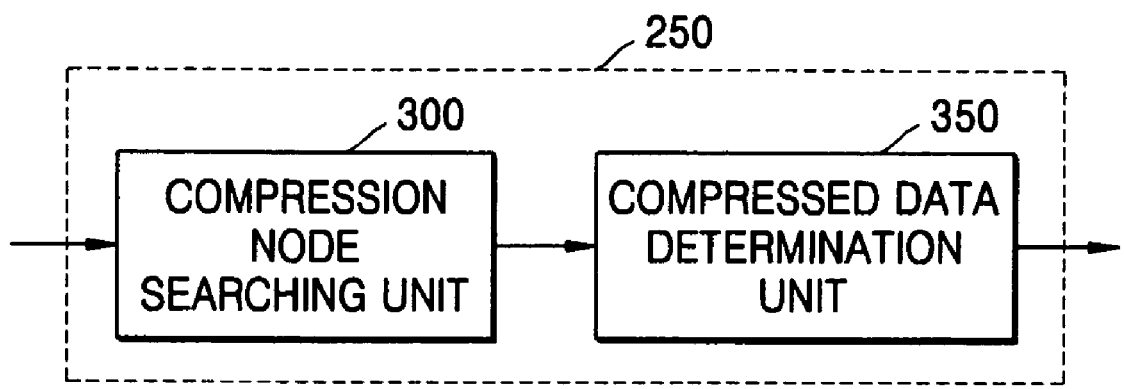
FIG. 3 is a detailed block diagram of the compression determination unit of FIG. 2.

The compression determination unit 250 determines whether the scene file generated by the XMT parser 210 contains graphics data that is not compressed. Referring to FIG. 3, the compression determination unit 250 includes a compression node detector 300 and a compressed data determination unit 350. The compression node detector 300 detects at least one BitWrapper node from the scene file. The compressed data determination unit 350 determines that the scene file contains uncompressed object data when graphics data is included in the detected BitWrapper node.

The AFX encoding unit 260 parses the XMT file 200 in units of keywords that are the names of nodes, and encodes the graphics data into a bitstream using the encoding parameters included in the scene file and generates a modified scene file and a modified mux file when the compression determination unit 250 determines that the graphics data in the scene file is not compressed.

Figure 4:
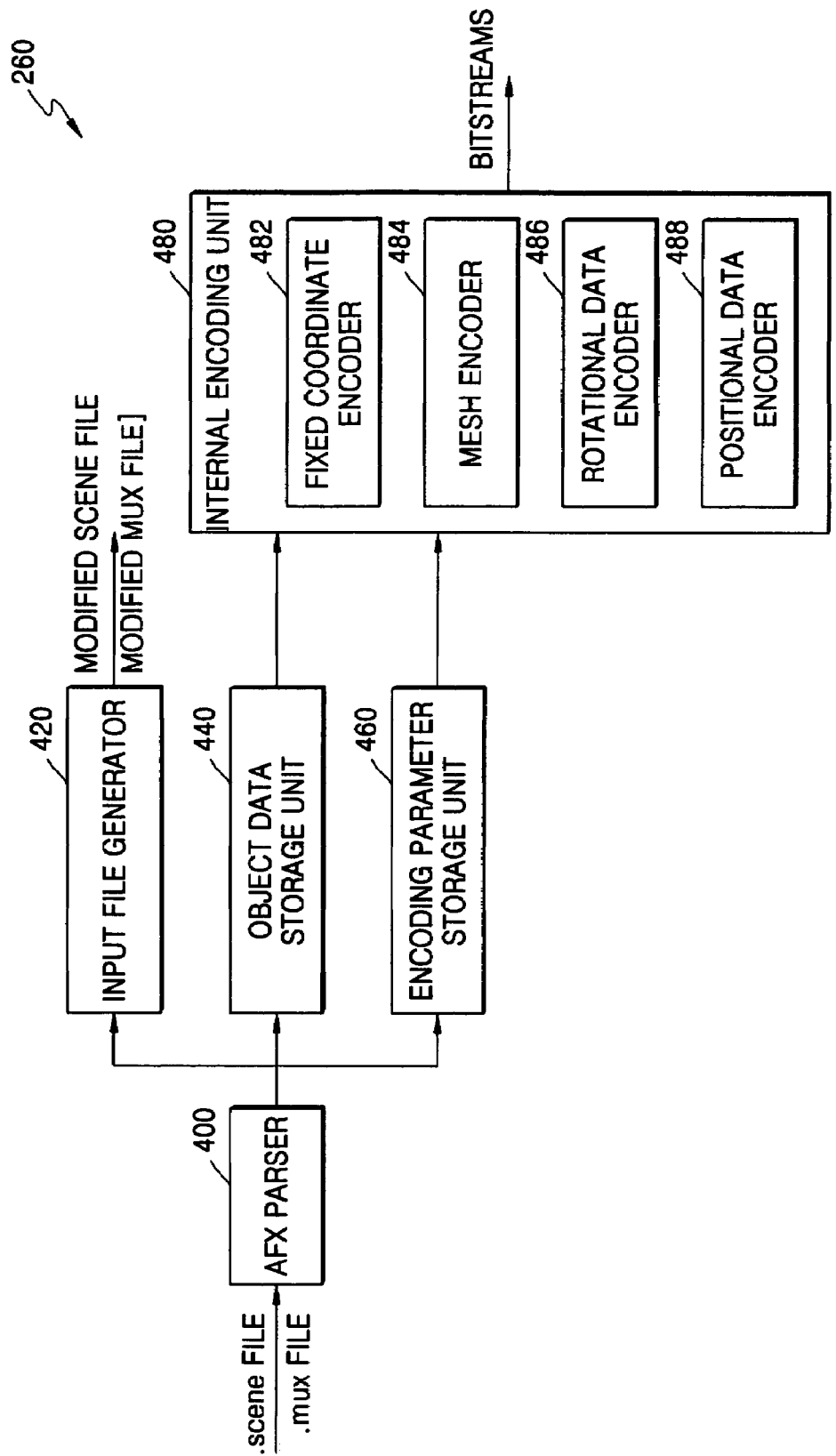
FIG. 4 is a detailed block diagram of an AFX encoding unit of FIG. 2.

FIG. 4 is a detailed block diagram of the AFX encoding unit 260. The AFX encoding unit 260 includes an AFX parser 400, an input file generator 420, an object data storage unit 440, an encoding parameter storage unit 460, and an internal encoding unit 480.

The AFX parser 400 detects at least one compression node from the scene file that includes the BitWrapper node, and stores the 3D graphics data and the encoding parameters included in the compression node of the scene file when the node field of the compression node contains 3D graphics data. More specifically, the scene and mux files containing uncompressed object data are input to the AFX parser 400. The scene file contains scene information and uncompressed 3D graphics data. The mux file includes information regarding a buffer size in which data is to be transmitted and the type of a decoder that decodes a transmitted bitstream, and synchronization information specifying a time sequence in which a plurality of data are to be played. Thus, the AFX parser 400 stores nodes and encoding parameters used by the scene and mux files as keywords, and reads and parses the scene and mux files in units of keywords, using the nodes and the encoding parameters. When a node containing object data that is to be compressed is detected, the AFX parser 400 stores the object data and the values of the encoding parameters required for data compression in the encoding parameter storage unit 460 while parsing the scene and mux files. The values of the encoding parameters stored in the encoding parameter storage unit 460 are grouped by types of nodes and transmitted to related encoding units of internal encoding unit 480, respectively.

Also, since the AFX parser 400 supports both a single BitWrapper node and a multiple BitWrapper node, it is possible to transmit all 3D graphics data consisting of several nodes either to one of a buffer and a URL, or to both the buffer and the URL, as a user desires.

The AFX parser 400 stores the object data output from the object data storage unit 440.

The encoding parameter storage unit 460 stores the encoding parameters output from the AFX parser 400.

The internal encoding unit 480 includes encoding units related to MPEG-4 AFX tools corresponding to the types of nodes containing the stored object data. In detail, the internal encoding unit 480 encodes the object data stored in the object data storage unit 440 into a bitstream using the encoding parameters in the encoding parameter storage unit 460. The internal encoding unit 480 includes at least one of a fixed point coordinate encoder 482, a mesh encoder 484, a rotational data encoder 486, and a positional data encoder 488. However, encoders included in the internal encoding unit 480 are not limited. One of the encoding units of the internal encoding unit 480 is selected according to the type of a node field of a compression node that contains 3D graphics object data that is to be compressed. The selected encoding unit receives the uncompressed 3D graphics object data from the object data storage unit 440 and the encoding parameters from the encoding parameter storage unit 460, and encodes the 3D graphics object data into a bitstream using the encoding parameters.

The fixed-point coordinate encoder 482 encodes keyframe animation data of coordinates of a fixed point of an object that is to be compressed using parameters corresponding to the stored object data and encoding parameters. The mesh encoder 484 encodes 3D mesh information using related parameters corresponding to the stored object data and encoding parameters.

The rotational data encoder 486 encodes rotational keyframe animation data using parameters corresponding to the stored object data and encoding parameters. The positional data encoder 488 encodes motion keyframe animation data using parameters corresponding to the stored object data and encoding parameters.

When graphics object data is included in the node field of the compression node of the AFX parser 400, the input file generator 420 generates a modified scene file _modified-.scene obtained by deleting object data and encoding parameters from respective compression nodes of the scene file, and a modified mux file _modified.mux that is modified such that the name of a file output from the BIFS encoding unit 270 can reflect the name of the modified scene file _modified.scene.

As described above, the modified scene file _modified-.scene and the modified mux file _modifiedmux output from the AFX encoding unit 260 can be input to the BIFS encoding unit 270 and the MP4 encoding unit 280, respectively. When these files are input to the BIFS encoding unit 270 and the MP4 encoding unit 280, an ".mp4" bitstream file 290 is generated. The mp4 bitstream file 290 is executed and visualized by an MPEG-4 Player.

Whether an appropriate encoder of the internal encoding unit 480 is selected according to the type of uncompressed object data and the values of compression parameters, is determined by checking an output compressed bitstream.

The XMT file 200 of FIG. 2 may be largely categorized into five types. A first type of the XMT file 200 is used for transmission of compressed graphics object data to an MPEG-4 encoding unit (not shown) using a buffer field (first case). A second type of the XMT file 200 is used for transmission of the compressed graphics object data to the MPEG-4 encoding unit using a URL field (second case). A third type of the XMT file 200 is used to encode uncompressed graphics object data using the AFX encoding unit 260 and transmit the result of encoding to the MPEG-4 encoding unit using the buffer field (third case). A fourth type of the XMT file 200 is used to encode the uncompressed graphics object data by the AFX encoding unit 260 and transmit the result of encoding to the MPEG-4 encoding unit using the URL field (fourth case). A fifth type of the XMT file 200 can be used when the above first through fourth cases are mixed (fifth case). A scene file and a mux file are generated suitably for the above five cases.

The first type of the XMT file 200 input to the XMT parser 210 consists of a header having an InitialObjectDescriptor and a body having at least one compression node. The InitialObjectDescriptor of the header includes StreamSource reflecting the name of a file output from the BIFS encoding unit 270, Decoding information regarding decoding of the compressed file from BIFS encoding unit and synchronization information specifying a time sequence in which graphics objects are displayed. The compression node of the body includes a node field storing the names of already compressed nodes, and a buffer field storing the names of already compressed object data files. The scene file includes at least one compression node that is equivalent to that in the body. The mux file includes an InitialObjectDescriptor that is equivalent to that in the header, and stream format information that is included in the InitialObjectDescriptor and output from the BIFS encoding unit 270.

The second type of the XMT file 200 input to the XMT parser 210 consists of a header that includes an InitialObjectDescriptor; and a body that includes at least one compression node and a ObjectDescriptorUpdate with at least one objectDescriptor. The InitialObjectDescriptor of the header includes StreamSource reflecting the name of a file output from BIFS encoding unit 270, decoding information regarding decoding of the compressed file from BIFS encoding unit and synchronization information regarding a time sequence in which graphics objects are displayed. The compression node of the body includes URL ID that is equivalent to those of ObjectDescriptor of ObjectDescriptorUpdate including BitWrapperEncodingHints that contains the name of a file storing a bitstream of already compressed object data. The objectDescriptor in the ObjectDescriptorUpdate of the body includes binary ID, as a field, that has the same value as the URL ID of compression node in the body, and AFXConfig being information regarding decoding of the compressed object data; and BitWrapperEncodingHints defining a name of a file storing the bitstream of the compressed object data and type of compression format of the compressed bitstream. The scene file includes at least one compression node that is equivalent to those of the body; and an ObjectDescriptorUpdate that has ObjectDescriptor contataining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body. The mux file includes an InitialObjectDescriptor and an objectDescriptor that are equivalent to those of ObjectDescriptorUpdate in the body.

The third type of the XMT file 200 input to the XMT parser 210 consists of a header having an InitialObjectDescriptor and a body having at least one compression node. The InitialObjectDescriptor of the header contains StreamSource reflecting the name of a file output from the BIFS encoding unit 270, Decoding information regarding decoding of the compressed file from BIFS encoding unit and synchronization information regarding a time sequence in which graphics objects are displayed. The compression node of the body includes a node field storing the name of a node that is to be compressed, object data that is to be compressed and included in a node field of the node, object data included in the node, encoding parameters used for encoding the object data, and a buffer field storing the name of a bitstream file of the object data encoded using the encoding parameters. The scene file includes at least one compression node that is equivalent to that of the body. The mux file includes an InitialObjectDescriptor that is equivalent to that of the header, and stream format information regarding a file that is output from the BIFS encoding unit 270 and included in the InitialObjectDescriptor.

The fourth type of the XMT file 200 input to the XMT parser 210 consists of a header that includes an InitialObjectDescriptor; and a body that includes an ObjectDescriptorUpdate having at least one compression node and at least one objectDescriptor. The InitialObjectDescriptor of the header includes StreamSource reflecting the name of a file output from the BIFS encoding unit 270, decoding information regarding decoding of the compressed file from BIFS encoding unit and synchronization information regarding a time sequence in which graphics objects are displayed. The compression node of the body includes a node field storing the name of a node that is to be compressed, object data that is included in the node field and is to be compressed, encoding parameters for compression of the object data, and a field storing URL ID that is equivalent to those of ObjectDescriptor of ObjectDescriptorUpdate including BitWrapperEncodingHints that contatins the name of a file storing a bitstream of the object data encoded using the encoding parameters. The objectDescriptor included in the ObjectDescriptorUpdate of the body includes binary ID, as field, that has the same value as the URL ID of compression node in the body, and AFX-Config being information regarding decoding of the compressed object data; and BitWrapperEncodingHints defining a name of a file storing the bitstream of the compressed object data and type of compression format of the compressed bitstream. The scene file includes at least one compression node and an ObjectDescriptorUpdate that has ObjectDescriptor contatining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body. The mux file includes an InitialObjectDescriptor and an objectDescriptor that are equivalent to those of ObjectDescriptorUpdate in the body.

The fifth type of the XMT file 200 input to the XMT parser 210 consists of a header that includes an InitialObjectDescriptor and a body that includes at least one compression node with a buffer field, at least one compression node with a URL field, and an ObjectDescriptorUpdate with objectDescriptors, a number of which is equivalent to that of the compression nodes that include the URL field. The InitialObjectDescriptor of the header includes StreamSource reflecting the name of a file output from the BIFS encoding unit 270, decoding information regarding decoding of the compressed file from BIFS encoding unit and synchronization information regarding a time sequence in which graphics objects are displayed. The compression node of the body that has the buffer field includes a node field storing names of nodes that will be compressed, object data that is included in the node field and is to be compressed, encoding parameters for compression of the object data, and a buffer field storing the name of a bitstream of the object data encoded using the encoding parameters. The compression node of the body that has the URL field includes a node field storing the name of a node that will be compressed, object data that is included in the node field and is to be compressed, encoding parameters for compression of the object data, and a field that that is equivalent to those of ObjectDescriptor of ObjectDescriptorUpdate including BitWrapperEncodingHints that contatins the name of a file storing a bitstream of the object data encoded using the encoding parameters. The objectDescriptor included in the ObjectDescriptorUpdate of the body has binary ID as a field that has the same value as the URL ID of compression node in the body, and AFXConfig being information regarding decoding of the compressed object data; and BitWrapperEncodingHints defining a name of a file storing the bitstream of the compressed object data and type of compression format of the compressed bitstream. The scene file has a compression node that is equivalent to those of the body; and ObjectDescriptorUpdate that has ObjectDescriptor contatining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file has an InitialObjectDescriptor and an objectDescriptor that are equivalent to those of ObjectDescriptorUpdate in the body.

The system of FIG. 2 will now be described in greater detail. First, the structure of the compression node in which 3D graphics data is compressed, and a method of compressing the 3D graphics data using an XMT-A schema regarding encoding parameter, will be described.

The conventional XMT technique is not capable of parsing an input XMT file regarding 3D graphics data compression due to absence of definition of the XMT-A schema regarding the compression. To solve this problem, as shown in FIG. 2, the present invention provides the XMT schema 230 that defines the compression node regarding 3D graphics data compression and encoding parameters. Thus, when the input XMT file 200 that defines 3D graphics data compression using the compression node is input to the XMT parser 210, the XMT parser 210 can parse it according to the XMT-A schema 230, the XMT2MUX style sheet 220, and the XMT2BIFS style sheet 240. If the XMT file 200 contains compressed data, the XMT parser 210 parses the XMT file 200 and generates input files such as a scene file and a mux file that can be input to an MPEG-4 encoding unit without additional processes. If not so, i.e., the XMT file 200 contains the original data that is not compressed, the original data is encoded by the AFX encoding unit 260, and then, the XMT parser 210 generates input files, i.e., modified scene and mux files, that can be input to the MPEG-4 encoding unit.

The MPEG-4 encoding unit includes the BIFS encoding unit 270 and the MP4 encoding unit 280. When the generated scene and mux files are input to the BIFS encoding unit 270 and the MP4 encoding unit 280, respectively, the .mp4 bitstream 290 is generated, visualized by an MPEG-4 player (not shown), and displayed on a display.

Use of the compression node and meta representation of encoding parameters, i.e., the XMT-A schema 230, allows an author to determine whether 3D graphics data is to be compressed during an authoring process, depending on whether the meta representation is selected or not. Also, when the author determines to compress the 3D graphics data, the encoding parameters regarding the 3D graphics data may be represented using the meta language.

If the author determines to compress the 3D graphics data, the author can transmit the 3D graphics data to the MPEG-4 encoding unit while adjusting the parameters, using one of the following ways of: (i) encoding the 3D graphics data into a bitstream using the AFX encoding unit 260 and transmitting the bit steam to the MPEG-4 encoding unit; and (ii) transmitting an already-compressed bitstream to the MPEG-4 encoding unit.

The above ways are subdivided into the following five ways: (i) an already compressed bitstream is transmitted using a buffer; (ii) already compressed bitstream is transmitted using a URL; (iii) object data is compressed into a bitstream using encoding parameters and the bitstream is transmitted using a buffer; (iv) object data is compressed into a bitstream using encoding parameters and the bitstream is transmitted using a URL; and (v) at least two ways of the above ways (i) through (iv) are used together for transmission of object data. The author can transmit the 3D data using one of the above five ways.

Next, a method of representing factors required to compress 3D graphics data using the meta language, i.e., using the XMT, will now be described. In the method, compression node and parameters regarding compression of the 3D graphics data are presented using the meta language. In this disclosure, the method will be described with respect to a "BitWrapper" node and parameters required for compression of the 3D graphics data.

```
BitWrapper { #%NDT=SF2Dnode, SF3DNode,SFGeometryNode
    field    SFWorldNode            node     NULL
    field    SFInt32         type   0
    field    MFURL                  URL      [ ]
    field    SFString               buffer'"}
```

1. XMT-A Schema Regarding BitWrapper Node 1.1 BIFS Syntax Regarding BitWrapper Node In brief, the "BitWrapper" node defines compression of data contained in a node field into a bitstream and transmission of the bitstream using an in-band bitstream or an out-band bitstream. The "URL" field defines transmission of the data as the out-band bitstream, and the "buffer" field defines transmission of the data as the in-band bitstream such as a BIFS bitstream.

If the author desires to compress and transmit the data using the "BitWrapper" node, the author must adjust parameters for generating a bitstream. Parameters can be adjusted using XMT-A schema syntax. However, since the parameters are related to decoding syntax other than particular encoding syntax, they can be adjusted during data compression. The BitWrapper node supports transmission of a bitstream compressed using compression tools regarding three types of 3D keyframe animation nodes, such as a CoordinateInterpolator node, an OrientationInterpolator node, and a PositionInterpolator node, and a 3D mesh information node such as IndexedFaceSet node.

XMT-A schema syntax regarding parameters for the BitWrapper node and the three CoordinateInterpolator, OrientationInterpolator, and PositionInterpolator nodes, and the IndexedFaceSet node will now be described.

1.2 XMT-A Schema Regarding BitWrapper Node 1.2.1 Syntax

```
<annotation>
    <documentation>
                            ******************************************
                            * Declaration of BitWrapper    *
                            ******************************************
    </documentation>
</annotation>
<complexType name="BitWrapperType">
    <all>
                        <element ref="xmta:IS" minOccurs="0"/>
                        <element name="node" form="qualified" minOccurs="0">
                            <complexType>
                                <group ref="xmta:SFWorldNodeType" minOccurs="0" />
                            </complexType>
                        </element>
                        <element ref="xmta:BitWrapperEncodingParameter"/>
    </all>
    <attribute name="type" type="xmta:SFInt32" use="optional" default="0"/>
    <attribute name="url" type="xmta:MFUrl" use="optional"/>
    <attribute name="buffer" type="xmta:SFString" use="optional" default=""""/>
    <attributeGroup ref="xmta:DefUseGroup"/>
</complexType>
<element name="BitWrapper" type="xmta:BitWrapperType"/>
<element name="BitWrapperEncodingParameter">
    <complexType>
        <choice>
            <element    name="CoordinateInterpolatorEncodingParameter"     minOccurs="0" maxOccurs="1">
                <complexType>
                    <attribute name="keyQBits" type="xmta:numOfKeyQBits" use="optional" default="8"/>
                    <attribute name="keyValueQBits" type="xmta:numOfKeyValueQBits" use="optional" default="16"/>
                    <attribute    name="transpose"    type="xmta:transposeType"    use="optional" default=""ON""/>
                    <attribute name="linearKeycoder" type="xmta:linearKeycoderType" use="optional"
                            default=""LINEAR""/>
                </complexType>
            </element>
            <element name="IndexedFaceSetEncodingParameter" minOccurs="0" maxOccurs="1">
                <complexType>
                    <attribute    name="coordQBits"    type="xmta:numOfCoordQBits"    use="optional" default="10"/>
                    <attribute    name="normalQBits"    type="xmta:numOfNormalQBits"    use="optional" default="9"/>
                    <attribute name="colorQBits" type="xmta:numOfColorQBits" use="optional" default="6"/>
                    <attribute    name="texCoordQBits"    type="xmta:numOftexCoordQBits"    use="optional" default="10"/>
                    <attribute    name="coordPredMode"    type="xmta:coordPredType"    use="optional" default="2"/>
                    <attribute name="normalPredMode" type="xmta:normalPredType" use="optional" default="0"/>
                    <attribute name="colorPredMode" type="xmta:colorPredType" use="optional" default="0"/>
                    <attribute name="texCoordPredMode" type="xmta:texCoordPredType" use="optional"
```

-continued

```
default="0"/>
                                    <attribute name="errorResilience" type="xmta:errorResilienceType" use="optional"
                                            default=""OFF""/>
                                    <attribute name="bitsPerPacket" type="xmta:SFInt32" use="optional" default="180"/>
                                    <attribute name="boundaryPrediction" type="xmta:boundaryPredictionType" use="optional"
                                            default="0"/>
                            </complexType>
                    </element>
                    <element name="OrientationInterpolatorEncodingParameter" minOccurs="0" maxOccurs="1">
                            <complexType>
                                    <attribute name="keyQBits" type="xmta:numOfKeyQBits" use="optional" default="8"/>
                                    <attribute   name="keyValueQBits"   type="xmta:numOfKeyValueQBits"   use="optional"
default="16"/>
                                    <attribute name="preservingMode" type="xmta:preservingType" use="optional"
                                            default=""KEY""/>
                                    <attribute name="dpcmMode" type="xmta:orientationDpcmType" use="optional"
default="0"/>
                                    <attribute name="aacMode_X" type="xmta:aacType" use="optional"
                                            default=""BINARY""/>
                                    <attribute name="aacMode_Y" type="xmta:aacType" use="optional"
                                            default=""BINARY""/>
                                    <attribute name="aacMode_Z" type="xmta:aacType" use="optional"
                                            default=""BINARY""/>
                                    <attribute name="linearKeycoder" type="xmta:linearKeycoderType" use="optional"
                                            default=""LINEAR""/>
                            </complexType>
                    </element>
                    <element name="PositionInterpolatorEncodingParameter" minOccurs="0" maxOccurs="1">
                            <complexType>
                                    <attribute name="keyQBits" type="xmta:numOfKeyQBits" use="optional" default="8"/>
                                    <attribute name="keyValueQBits" type="xmta:numOfKeyValueQBits" use="optional"
default="16"/>
                                    attribute name="preservingMode" type="xmta:preservingType" use="optional"
                                            default=""KEY""/>
                                    <attribute name="dpcmMode_X" type="xmta:positionDpcmType" use="optional" default="0"/>
                                    <attribute name="dpcmMode_Y" type="xmta:positionDpcmType" use="optional" default="0"/>
                                    <attribute name="dpcmMode_Z" type="xmta:positionDpcmType" use="optional" default="0"/>
                                    <attribute name="aacMode_X" type="xmta:aacType" use="optional"
                                            default=""BINARY""/>
                                    <attribute name="aacMode_Y" type="xmta:aacType" use="optional"
                                            default=""BINARY""/>
                                    <attribute name="aacMode_Z" type="xmta:aacType" use="optional"
                                            default=""BINARY""/>
                                    <attribute name="linearKeycoder" type="xmta:linearKeycoderType" use="optional"
                                            default=""LINEAR""/>
                                    <attribute name="intra_X" type="xmta:intraType" use="optional" default="0"/>
                                    <attribute name="intra_Y" type="xmta:intraType" use="optional" default="0"/>
                                    <attribute name="intra_Z" type="xmta:intraType" use="optional" default="0"/>
                            </complexType>
                    </element>
                    <element name="PointTextureEncodingParameter" minOccurs="0" maxOccurs="1">
                            <complexType>
                                    <attribute name="codingPercent" type="xmta:codingPercentType" use="optional"
default="100"/>
                            </complexType>
                    </element>
            </choice>
    </complexType>
</element>
```

1.2.2. Semantics

The "BitWrapper" node is a dedicated scheme for node compression. The representation of compressed data is transmitted as the BIFS stream or a stream separated from the BIFS stream. When a stream is transmitted within BIFSUpdate, the "buffer" field contains representation of compressed data. If the stream is transmitted separately from the BIFSUpdate, the "URL" field contains the URL of the stream. The "buffer" field and the "URL" field are not compatible with each other. That is, the "URL" field is not used during use of the "buffer" field, and vice versa. The "node" field includes a node containing representation of compressed data. The "BitWrapper" node can be used at a "node". The "type" field indicates that a node compression scheme must be used. 0 is a default value of the "type" field. The value of the "type" field is determined in consideration of a possibility that a further scheme for node compression will be developed for the same node. Therefore, a default scheme is defined.

The "CoordinateInterpolatorEncodingParameter" field defines parameters for compression of vertex coordinates of an object in the keyframe-based animation data, i.e., Coordinate Interpolator node data. In this case, the "node" field is a "CoordinateInterpolator" node.

The "IndexedFaceSetEncodingParameter" field defines parameters for compression of 3D mesh information, i.e., IndexedFaceSet node data. In this case, the "node" field is an "IndexedFaceSet" node.

The "OrientationInterpolatorEncodingParameter" field defines parameters for compression of rotational keyframe-based animation data, i.e., Orientation Interpolator node data. In this case, the "node" field is an "OrientationInterpolator" node.

The "PositionInterpolatorEncodingParameter" field defines parameters for compression of position keyframe-based animation data, i.e., PositionInterpolator node data. In this case, the "node" field is a "PositionInterpolator" node.

In case where parameters are not used during data compression, they may not be specified in a file. When data is compressed using parameters, each parameter field must be used individually since only one "node" field corresponds to only one type of node data that is to be compressed and the parameter fields are grouped by a "<choice>" element. An "attribute" of each parameter field will later be described.

When representation of compressed data is included in a separate stream and transmitted, a node decoder must be presented in a predetermined frame.

In an object descriptor stream, node decoders must be defined in DecoderConfig descriptor with respect to "streamType 0x03" and "objectTypeIndication 0x05". The decoder is configured with an AFXConfig descriptor.

```
1.3. numOfKeyQBits
1.3.1 Syntax
<simpleType name="numOfKeyQBits">
    <restriction base="int">
        <minInclusive value="0">
        <maxInclusive value="31"/>
    </restriction>
</simpleType>
```

1.3.2 Semantics numOfKeyQBits indicates a quantization bit size of key data and has an integer value. The minimum and maximum values of numOfKeyQBits are 0 and 31, respectively.

```
1.4 numOfKeyValueQBits
1.4.1 Syntax
<simpleType name="numOfKeyValueQBits">
    <restriction base="int">
        <minInclusive value="0"/>
        <maxInclusive value="31"/>
    </restriction>
</simpleType>
```

1.4.2 Semantics numOfKeyValueQBits indicates a quantization bit size of keyValue data and has an integer value. The minimum and maximum values of numOfKeyQBits are 0 and 31, respectively.

```
1.5 linearKeycoderType
1.5.1 Syntax
<simpleType name="linearKeycoderType">
    <restriction base="string">
        <enumeration value=""LINEAR""/>
        <enumeration value=""NOLINEAR""/>
    </restriction>
</simpleType>
```

1.5.2 Semantics linearKeycoderType is a string type and indicates whether a linear key coder is used or not.

```
1.6 preservingType
1.6.1 Syntax
<simpleType name="preservingType">
    <restriction base="string">
        <enumeration value=""KEY""/>
        <enumeration value=""PATH""/>
    </restriction>
</simpleType>
```

1.6.2 Semantics preservingType is a string type and indicates whether a current mode is a key preserving mode or a path preserving mode.

```
1.7 aacType
1.7.1 Syntax
<simpleType name="aacType">
    <restriction base="string">
        <enumeration value=""BINARY""/>
        <enumeration value=""UNARY""/>
    </restriction>
</simpleType>
```

1.7.2 Semantics aacType is a string type and indicates whether a current is BinaryAAC mode or a UnaryAAC mode with respect to keyValue components (X, Y, Z, (Theta—OrientationInterpolator)).

```
1.8 orientationDpcmType
1.8.1 Syntax
<simpleType name="orientationDpcmType">
    <restriction base="int">
        <enumeration value="0"/>
        <enumeration value="1"/>
        <enumeration value="2"/>
    </restriction>
</simpleType>
```

1.8.2 Semantics orientationDpcmType indicates the order of DPCM used with respect to the respective keyValue components (X, Y, Z, Theta) in OrientationInterpolator node, and has an integer value. orientationDpcmType may have a value of 0, 1, or 2. If orientationDpcmType has a value of 0, it means that it uses $1^{st}$ order DPCM. If orientationDpcmType has a value of 1, it means that it uses $2^{nd}$ order DPCM. If orientationDpcmType has a value of 2, it means that it uses a Smart DPCM. And the value is 2 if the orientation interpolator encoder automatically determines the order of DPCM.

```
1.9 positionDpcmType
1.9.1 Syntax
<simpleType name="positionDpcmType">
    <restriction base="int">
        <enumeration value="0"/>
        <enumeration value="1"/>
        <enumeration value="2"/>
    </restriction>
</simpleType>
```

1.9.2 Semantics positionDpcmType denotes a degree of DPCM with respect to the respective keyValue components (X, Y, Z), and has an integer value. If the degree of DPCM is 1, the flags are set to 0. If the degree of DPCM is 2, the flags are set to 1. When a SAD is used, the flags are set to 2.

```
1.10 intraType
1.10.1 Syntax
<simpleType name="intraType">
    <restriction base="int">
        <enumeration value="0"/>
        <enumeration value="1"/>
    </restriction>
</simpleType>
```

1.10.2 Semantics intraType is used for Position Interpolator Compression. IntraType indicates whether an intra coding mode is used with respect to the respective keyValue components (X,Y,Z).

```
1.11 transposeType
1.11.1 Syntax
<simpleType name="transposeType">
    <restriction base="string">
        <enumeration value=""ON""/>
        <enumeration value=""OFF""/>
    </restriction>
</simpleType>
```

1.11.2 Semantics transposeType denotes a flag for a transpose mode or a vertex mode. If the value of transposeType is set to "ON", the transpose mode is used. Otherwise, the vertex mode is used.

```
1.12 numOfCoordQBits
1.12.1 Syntax
<simpleType name="numOfCoordQBits">
    <restriction base="int">
        <minInclusive value="1"/>
        <maxInclusive value="24"/>
    </restriction>
</simpleType>
```

1.12.2 Semantics numOfCoordQBits denotes a quantization step used for geometry. The minimum and maximum values of numOfCoordQBits are 1 and 24, respectively.

```
1.13 numOfNormalQBits
1.13.1 Syntax
<simpleType name="numOfNormalQBits">
    <restriction base="int">
        <minInclusive value="3"/>
        <maxInclusive value="31"/>
    </restriction>
</simpleType>
```

1.13.2 Semantics numOfNormalQBits denotes a quantization step for normals. The minimum and maximum values of numOfNormalQBits are 3 and 31, respectively.

```
1.14 numOfColorQBits
1.14.1 Syntax
<simpleType name="numOfColorQBits">
    <restriction base="int">
        <minInclusive value="1"/>
        <maxInclusive value="16"/>
    </restriction>
</simpleType>
```

1.14.2 Semantics numOfColorQBits denotes a quantization step for colors. The minimum and maximum values of numOfColorQBits are 1 and 16, respectively.

```
1.15 numOfTexCoordQBits
1.15.1 Syntax
<simpleType name="numOftexCoordQBits">
    <restriction base="int">
        <minInclusive value="1"/>
        <maxInclusive value="16"/>
    </restriction>
</simpleType>
```

1.15.2 Semantics

NumOftexCoordQBits denotes a quantization step for texture coordinates. The minimum and maximum values of NumOftexCoordQBits are 1 and 16, respectively.

```
1.16 coordPredType
1.16.1 Syntax
<simpleType name="coordPredType">
    <restriction base="int">
        <enumeration value="0"/>
        <enumeration value="2"/>
    </restriction>
</simpleType>
```

1.16.2 Semantics

CoordPredType denotes the type of prediction value used to reconstruct the vertex coordinates of the mesh. When no_prediction is used, CoordPredType is set to 1. When parallelogram_prediction is used, CoordPredType is set to 2.

```
1.17 normalPredType
1.17.1 Syntax
<simpleType name="normalPredType">
    <restriction base="int">
        <enumeration value="0"/>
        <enumeration value="1"/>
        <enumeration value="2"/>
    </restriction>
</simpleType>
```

1.17.2 Semantics

NormalPredType allows normal values to be predicted. When no_prediction is selected, NormalPredType is set to 0. When tree_prediction is selected, NormalPredType is set to 1. When parallelogram_prediction is selected, NormalPredType is set to 2.

1.18 colorPredType
1.18.1 Syntax
```
<simpleType name="colorPredType">
    <restriction base="int">
        <enumeration value="0"/>
        <enumeration value="1"/>
        <enumeration value="2"/>
    </restriction>
</simpleType>
```

1.18.2 Semantics
colorPredType allows colors to be predicted. When no_prediction is selected, colorPredType is set to 0. When tree_prediction is selected, colorPredType is set to 1. When parallelogram_prediction is used, colorPredType is set to 2.

1.19 texCoordPredType
1.19.1 Syntax
```
<simpleType name="texCoordPredType">
    <restriction base="int">
        <enumeration value="0"/>
        <enumeration value="2"/>
    </restriction>
</simpleType>
```

1.19.2 Semantics
texCoordPredType allows colors to be predicted. If no_prediction is selected, texCoordPredType is set to 0. When parallelogram_prediction is selected, texCoordPredType is set to 2.

1.20 errorResilienceType
1.20.1 Syntax
```
<simpleType name="errorResilienceType">
    <restriction base="string">
        <enumeration value=""ON""/>
        <enumeration value=""OFF""/>
    </restriction>
</simpleType>
```

1.20.2 Semantics
ErrorResilienceType indicates whether an Error Resilience mode is used. If the Error Resilience mode is not used, ErrorResilienceType is set to "OFF". If the Error Resilience mode is used, ErrorResilienceType is set to "ON". Only when ErrorResilienceType is set to "ON", both boundaryPredictionType and bitsPerPacket shall be available.

1.21 boundaryPredictionType
1.21.1 Syntax
```
<simpleType name="boundaryPredictionType">
    <restriction base="int">
        <enumeration value="0"/>
        <enumeration value="1"/>
    </restriction>
</simpleType>
```

1.21.2 Semantics
BoundaryPredictionType indicates the type of boundary prediction. If BoundaryPredictionType has a value of 0, restricted prediction is used. If BoundaryPredictionType has a value of 1, extended prediction is used.

1.22 bitsPerPacket
1.22.1 Syntax
"bitsPerPacket" syntax is the same as the type of SFInt32.
```
<simpleType name="SFInt32">
    <restriction base="int"/>
</simpleType>
```

1.22.2 Semantics
BitsPerPacket denotes a packet size of an error resilient bitstream. The size of each partition in the error resilient mode is determined depending on the value of BitsPerPacket. bitsPerPacket is SFInt32 type and has a default value of 360.

2. XMT-A Schema for BitWrapperEncodingHints
2.1 Syntax
"BitWrapperEncodingHints" syntax is as follows:

```
<element name="StreamSource">
    <complexType>
        <choice minOccurs="0" maxOccurs="unbounded">
            <element ref="xmta:BitWrapperEncodingHints"/>
        </choice>
    </complexType>
</element>
<element name="BitWrapperEncodingHints">
    <complexType>
        <choice>
            <elementname="BitWrapper3DMCEncodingHints">
                <complexType>
                    <sequence>
                        <element name="sourceFormat">
                            <complexType>
                                <sequence>
                                    <element ref="xmta:param" minOccurs="0" maxOccurs="unbounded"/>
                                </sequence>
                            </complexType>
                        </element>
                        <element name="targetFormat">
                            <complexType>
                                <sequence>
```

```
                                                                <element    ref="xmta:param"
minOccurs="0" maxOccurs="unbounded"/>
                                                            </sequence>
                                                        </complexType>
                                                    </element>
                                                </sequence>
                                            </compleType>
                    </element>
                    <element name="BitWrapperICEncodingHints">
                        <complexType>
                            <sequence>
                                <element name="sourceFormat">
                                    <complexType>
                                        <sequence>
                                            <element    ref="xmta:param"
minOccurs="0" maxOccurs="unbounded"/>
                                        </sequence>
                                    </complexType>
                                </element>
                                <element name="targetFormat">
                                    <complexType>
                                        <sequence>
                                            <element    ref="xmta:param"
minOccurs="0" maxOccurs="unbounded"/>
                                        </sequence>
                                    </complexType>
                                </element>
                            </sequence>
                        </compleType>
                    </element>
                    <element name="OthersEncodingHints">
                        <complexType>
                            <sequence>
                                <element name="sourceFormat">
                                    <complexType>
                                        <sequence>
                                            <element    ref="xmta:param"
minOccurs="0" maxOccurs="unbounded"/>
                                        </sequence>
                                    </complexType>
                                </element>
                                <element name="targetFormat">
                                    <complexType>
                                        <sequence>
                                            <element    ref="xmta:param"
minOccurs="0" maxOccurs="unbounded"/>
                                        </sequence>
                                    </complexType>
                                </element>
                            </sequence>
                        </compleType>
                    </element>
                </choice>
            </complexType>
    </element>
```

2.2 Semantics

BitWrapperEncodingHints specifies a "MuxInfo" description in a script (.mux) file. In this case, the format of BitWrapperEncodingHints is equivalent to that of the binary textual format. The "BitWrapper" node is used for an out-band scenario using the "URL" field in the "BitWrapper" node. BitWrapperEncodingHints defines a stream format type of the "MuxInfo" description. BitWrapperEncodingHints includes three types of EncodingHints, i.e., BitWrapper3DMCEncodingHints, BitWrapperIC EncodingHints, and OthersEncodingHints. Also, for selection of one of the above three types of EncodingHints, they are grouped by a <choice> tag.

3. XMT-A Schema Regarding AFXConfig

3.1 Syntax

```
<element name="DecoderConfigDescriptor">
    <complexType>
        <sequence>
            <element name="decSpecificInfo" form="qualified" minOccurs="0">
                <complexType>
                    <choice minOccurs="0">
                        <element name="BIFSConfig" type="xmta:BIFSConfigType"/>
```

```
                    <element name="BIFSv2Config" type="xmta:BIFSv2ConfigType"/>
                    <element name="AFXConfig" type="xmta:AFXConfigType"/>
                    <element ref="xmta:DecoderSpecificInfo"/>
                </choice>
            </complexType>
        </element>
        <element name="profileLevelIndicationIndexDescr" form="qualified" minOccurs="0">
            <complexType>
                <sequence>
                    <element ref="xmta:ExtensionProfileLevelDescriptor" minOccurs="0" maxOccurs="unbounded"/>
                </sequence>
            </complexType>
        </element>
    </sequence>
    <attribute name="objectTypeIndication" type="xmta:objectTypeIndicationType" use="required"/>
    <attribute name="streamType" type="xmta:streamTypeType" use="required"/>
    <attribute name="upStream" type="boolean" use="optional" default="false"/>
    <attribute name="bufferSizeDB" type="xmta:bit24a" use="optional" default="auto"/>
    <attribute name="maxBitrate" type="xmta:bit32a" use="optional" default="auto"/>
    <attribute name="avgBitrate" type="xmta:bit32a" use="optional" default="auto"/>
    </complexType>
</element>
<complexType name="AFXConfigType">
    <choice>
        <element name="A3DMCDecoderSpecific"/>
        <element name="CoordInterpCompDecoderSpecific"/>
        <element name="OriInterpCompDecoderSpecific"/>
        <element name="PosInterpCompDecoderSpecific"/>
    </choice>
</complexType>
```

3.2 Semantics

When the AFX tool is encoded into a bitstream and the bitstream is transmitted using the BitWrapper node, AFX-Config provides information regarding decoding of the transmitted bitstream. The BitWrapper node is used for the out-band scenario using the "URL" field included in the BitWrapper node. That is, AFXConfig is very significant information indicating that the bitstream is encoded from the AFX tool, and the type of encoding information used to encode the AFX tool. Also, AFXConfig includes four types of decoding information, i.e., A3DMCDecoderSpecific, CoordInterpCompDecoderSpecific, OriInterpCompDecoderSpecific, and PosInterpCompDecoderSpecific.

4. Addition of BitWrapperEncodingHints into XMT2MUX Style Sheet

Addition of the MuxInfo and BitWrapperEncodingHints syntax into the XMT2MUX style sheet will now be described.

4.1 Syntax

The syntax of the original XMT2MUX style sheet is as follows:

```
<xsl:template match="xmt:StreamSource"> muxInfo {
    fileName <xsl:value-of select="@URL"/><xsl:text>
    <xsl:if test="not(xmt:EncodingHints)">streamFormat BIFS<xsl:text>
    </xsl:text></xsl:if>
    <xsl:apply-templates select="xmt:EncodingHints|xmt:BIFSEncodingHints| xmt:FBAEncodingHints"/>
    }
</xsl:template>
```

The MuxInfo syntax is added to the original XMT2MUX style sheet as follows:

```
<xsl:template match="xmt:StreamSource"> muxInfo MuxInfo{
    fileName <xsl:value-of select="@URL"/>
    <xsl:apply-templates select="xmt:EncodingHints|xmt:BIFSEncodingHints| xmt:FBAEncodingHints|xmt:BitWrapperEncodingHints"/>
    <xsl:if test="not(xmt:EncodingHints|xmt:BitWrapperEncodingHints)"> streamFormat BIFS<xsl:text></xsl:text></xsl:if>
    <xsl:if test="xmt:BitWrapperEncodingHints"><xsl:text>
    </xsl:text></xsl:if>
    <xsl:apply-templates select="xmt:BitWrapper3DMCEncodingHints|xmt:
```

```
BitWrapperICEncodingHints|xmt:OthersEncodingHints"/>
    }
    <xsl:template match="xmt:BitWrapperEncodingHints">
    <xsl:apply-templates      select="xmt:BitWrapper3DMCEncodingHints|xmt:
BitWrapperICEncodingHints|xmt:OthersEncodingHints"/>
    <xsl:apply-templates select="xmt:sourceFormat|xmt:targetFormat"/>
    </xsl:template>
    <xsl:template match="xmt:BitWrapper3DMCEncodingHints">
    <xsl:apply-templates select="xmt:sourceFormat|xmt:targetFormat"/>
    stream Format 3DMC<xsl:text>
    </xsl:text>
    </xsl:template>
    <xsl:template match="xmt:BitWrapperICEncodingHints">
    <xsl:apply-templates select="xmt:sourceFormat|xmt:targetFormat"/>
    streamFormat InterpolatorCompression<xsl:text>
    </xsl:text>
    </xsl:template>
    <xsl.template match="xmt:OthersEncodingHints">
    <xsl:apply-templates select="xmt:sourceFormat|xmt:targetFormat"/>
    streamFormat BIFS<xsl:text>
    </xsl:text>
    </xsl:template>
    <xsl:template match="xmt:sourceFormat">
    <xsl:apply-templates select="xmt:param"/>
    </xsl:template>
    <xsl:template match="xmt:targetFormat">
    <xsl:apply-templates select="xmt:param"/>
    </xsl:template>
</xsl:template>
```

4.2 Semantics

In the original syntax, the XMT2MUX style sheet does not sufficiently describe MUX information regarding a bitstream transmitted to an MP4 encoding unit. For instance, the name and types of the bitstream are not defined. Also, the XMT2MUX style sheet does not specify the information, e.g., the "bunny-15000-tcp.m3d" file of FIG. 6 and stream format, regarding a bitstream transmitted via an URL when the URL is defined in the "BitWrapper" node. Instead, the MT2MUX style describes the name of a file storing the bitstream and the type of the bitstream defined in the "BitWrapper" node. In detail, compression of 3D animation data is described in an InterpolatorCompression stream format, and compression of 3D mesh data is described in a 3DMC stream format.

5. Addition of XMT Style Sheets (XSLs)

The XMT parser 210 requires an XMT style sheet to make input files (.scene file and mux file) input to the MPEG-4 encoding unit based on the XMT-A schema. To output AFXConfig information in a format of the mux file, the XMT style sheet must be designed to include the AFXConfig information.

5.1. Addition of AFXConfig to XMT2MUX Style Sheet

AFXConfig that includes four types of decoding information is inserted in the XMT style sheet, as follows:

```
<xsl:template match="xmt:decSpecificInfo">
    <xsl:apply-templates    select="xmt:BIFSConfig    |xmt:BIFSv2Config
|xmt:DecoderSpecificInfo |xmt:AFXConfig"/>
    </xsl:template>
    <xsl:template match="xmt:AFXConfig">decSpecificInfo AFXConfig {
        afxext                                   <xsl:apply-templates
select="xmt:A3DMCDecoderSpecific|xmt:CoordInterpCompDecoderSpecific|xmt:PosInterpC
ompDecoderSpecific|xmt:OriInterpCompDecoderSpecific|xmt:MeshGridDecoderSpecificInfo|
xmt:WMDecoderSpecificInfo"/>
    }
    </xsl:template>
        <xsl:template match="xmt:A3DMCDecoderSpecific">
        A3DMCDecoderSpecific { } <xsl:text>
    </xsl:text>
    </xsl:template>
    <xsl:template match="xmt:CoordInterpCompDecoderSpecific">
    CoordInterpCompDecoderSpecific { } <xsl:text>
    </xsl:text>
    </xsl:template>
    <xsl:template match="xmt:PosInterpCompDecoderSpecific">
    PosInterpCompDecoderSpecific { } <xsl:text>
    </xsl:text>
    </xsl:template>
    <xsl:template match="xmt:OriInterpCompDecoderSpecific">
    OriInterpCompDecoderSpecific { } <xsl:text>
    </xsl:text>
    </xsl:template>
```

5.2. Change to decConfigDescr in XMT2MUX Style Sheet decConfigDescr includes decSpecificInfo required to decode a bitstream during a decoding process. To allow the XMT parser 210 to make a file input to the MPEG-4 encoding unit based on the XMT-A schema and the XMT style sheet, the XMT2MUX style sheet 220 must be modified as follows:

The original syntax is:

```
<xsl:template match="xmt:decConfigDescr">decConfigDescr { . . . }
```

The modified one is:

```
<xsl:template match="xmt:decConfigDescr">decConfigDescr
  DecoderConfigDescriptor { }
```

5.3. Change to slConfigDescr in XMT2MUX Style Sheet

SLConfigDescriptor represents time information required for synchronization between bitstreams during a decoding process. To allow the XMT parser 210 to make files input to the MPEG-4 encoding unit based on the XMT-A schema and the XMT style sheet, the XMT2MUX style sheet 220 must be modified as follows:

The original syntax is:

```
<xsl:template match="xmt:slConfigDescr">slConfigDescr { }
```

The modified one is:

```
<xsl:template match="xmt:slConfigDescr">slConfigDescr
  SLConfigDescriptor
  { . . . }
```

6. Change to ObjectDescriptorUpdate in XMT2BIFS Style Sheet 6.1 Syntax

The original syntax is:

```
<xsl:template match="xmt:ObjectDescriptorUpdate">
  UPDATE OD [
    <xsl:apply-templates select="xmt:OD"/>
  ]
</xsl:template>
```

The modified syntax is:

```
<xsl:template match="xmt:ObjectDescriptorUpdate">
UPDATE OD [
<xsl:apply-templates select="xmt:OD"/>
]
</xsl:template>
<xsl:template match="xmt:OD">
<xsl:apply-templates select="xmt:ObjectDescriptorBase" />
</xsl:template>
<xsl:template match="xmt:ObjectDescriptorBase">
<xsl:apply-templates            select="xmt:ObjectDescriptor|xmt:
InitialObjectDescriptor"/>
</xsl:template>
<xsl:template match="xmt:ObjectDescriptor">
ObjectDescriptor {
<xsl:if test="@objectDescriptorID">       objectDescriptorID <xsl:value-of
select="@objectDescriptorID"/></xsl:if>
<xsl:text></xsl:text><xsl:apply-templates select="xmt:URL" />
}
</xsl:template>
<xsl:template match="xmt:URL">
<xsl:if test="@URLstring"> muxScript
<xsl:value-of select="@URLstring"/></xsl:if>
<xsl:text></xsl:text>
</xsl:template>
```

6.2 Semantics

In the original "ObjectDescriptorUpdate" syntax, "Update OD" contains no description. In the changed "ObjectDescriptorUpdate" syntax, "Update OD" is used when an author links a scene description stream (BIFS stream) to another element stream via the "URL" field. Also, ObjectDescriptorID and a portion specifying the name of a script file are added into "Update OD". The format of the "ObjectDescriptorUpdate" syntax is equivalent to that of the binary textual format.

Figure 5:
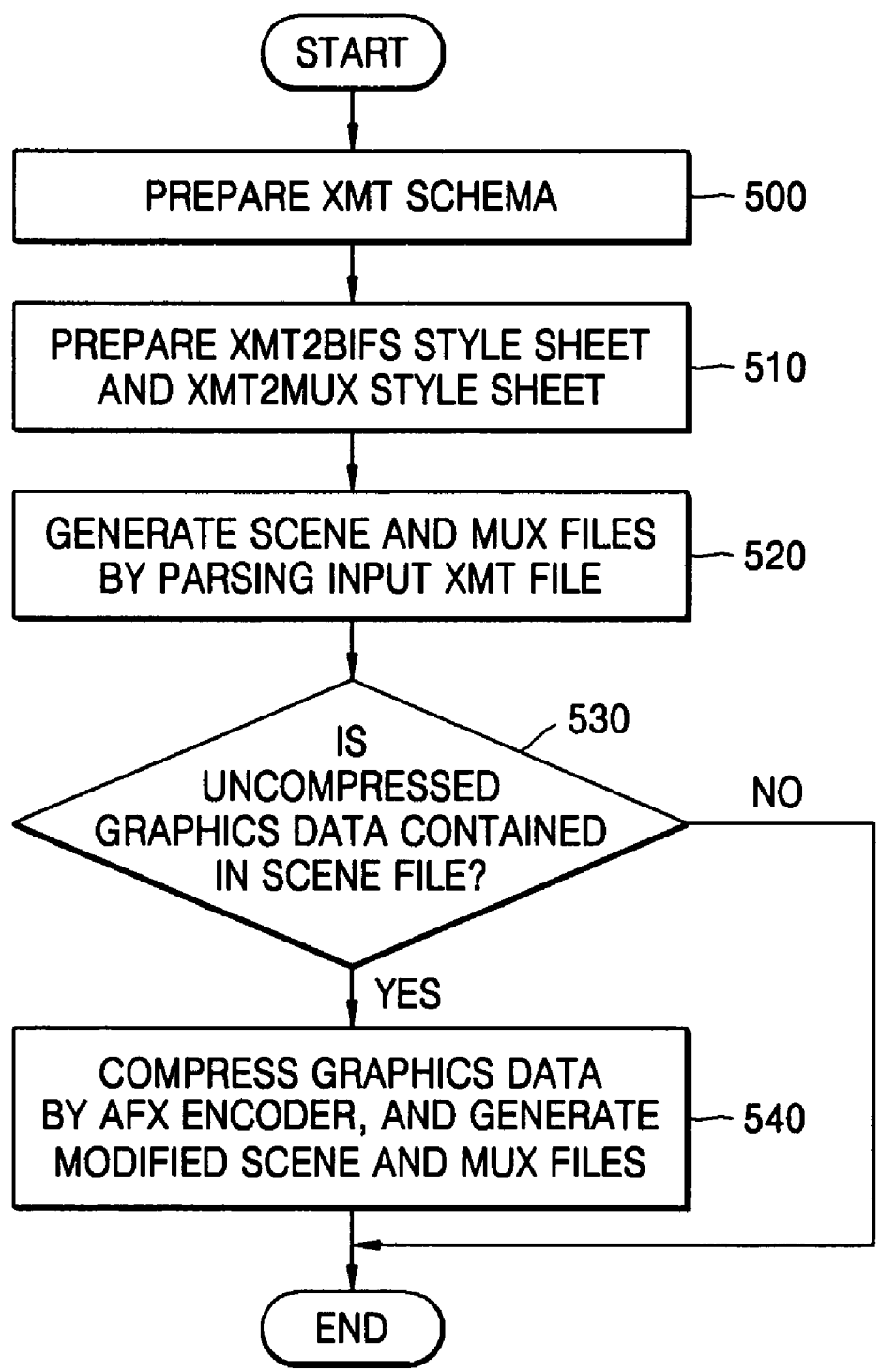
FIG. 5 is a flowchart of an exemplary method of generating an input file using meta representation of compression of graphics data according to an embodiment of the present invention.

FIG. 5 is a flowchart illustrating a method of generating an input file using meta representation of graphics data compression, according to an embodiment of the present invention. In the method of FIG. 5, an XMT schema that defines a compression node containing information regarding object data that will be compressed, encoding parameters required for data compression, and BitWrapperEncodingHints that at least describes location of compressed object data, is prepared (operation 500). Next, an XMT2BIFS style sheet that supports conversion of an Input XMT file into a scene file according to the XMT schema, and an XMT2MUX style sheet that supports conversion of the Input XMT file into a mux file according to the XMT schema, are prepared (operation 510). Next, when the Input XMT file is input to an XMT parser, the input XMT file is parsed using the XMT schema, the XMT2BIFS style sheet, and the XMT2MUX style sheet so as to obtain a scene file and a mux file (operation 520). Next, whether the scene file obtained by the result of parsing includes uncompressed graphics data is determined (operation 530). If the scene file contains uncompressed graphics data, the uncompressed graphics data is encoded into a bitstream using encoding parameters included in the scene file, and a modified scene file and a modified mux file are generated (operation 540).

More specifically, when already compressed graphics data is transmitted to a buffer or a URL, it is possible to make an input file input to a standard MPEG-4 encoding unit without the AFX encoding unit 260 of FIG. 2. However, when uncompressed graphics data is compressed into a bitstream using encoding parameters and the bitstream is transmitted to the buffer or the URL, the AFX encoding unit 260 is required to make the graphics data as an input file that can be input to the standard MPEG-4 encoding unit.

Figure 6:
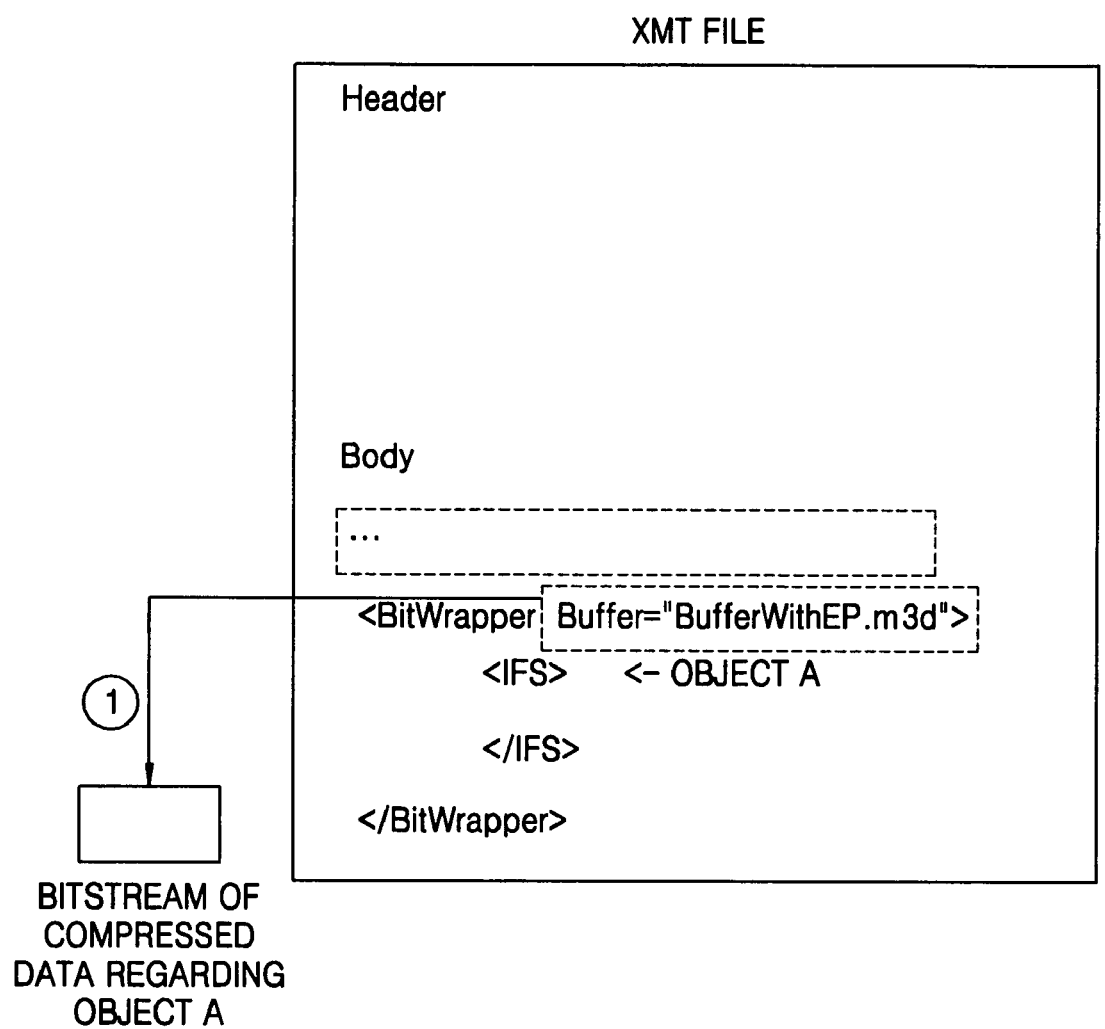
FIG. 6 illustrates an example of transmission of an already compressed bitstream to a buffer according to an embodiment of the present invention.

The following are methods of transmitting graphics data according embodiments of the present invention:

(1) A method of transmitting an already compressed bitstream to a buffer according to an embodiment of the present invention will be described with reference to FIGS. 2 and 6. As indicated by an arrow ① of FIG. 6, the already compressed bitstream of 3D data, e.g., geometry information, connection information, and color information, regarding an object A such as a cup has already been compressed into a bitstream and the bitstream is transmitted to "BufferWithoutEP.m3d" buffer field in a compression node.

As shown in FIG. 2, when the XMT file 200 is input to the XMT parser 210, the XMT parser 210 inserts the bitstream together with scene data into a ".scene" bitstream according to the XMT schema 230 using the XMT schema and the XMT2BIFS style sheet 240 and the XMT2MUX style sheet 220, and transmits the ".scene" bitstream.

The XMT file includes a header that has an InitialObjectDescriptor, and a body that has at least one compression node. The InitialObjectDescriptor of the header contains StreamSource presenting the name of a file output from the BIFS encoding unit 270, decoding information regarding decoding of the compressed file from BIFS encoding unit and synchronization information regarding a time sequence in which graphics objects are displayed. The compression node of the body includes a node field that stores the name of an already compressed node and a buffer field that stores the name of an already compression object data.

The scene file includes at least one compression node that is equivalent to that of the body. The mux file includes an InitialObjectDescriptor that is equivalent to that of the header, and stream format information regarding a file that is included in the InitialObjectDescriptor and output from the BIFS encoding unit 270.

The mux file contains a ".bifs/.od" file generated by the BIFS encoding unit 270 that is a type of the MPEG-4 encoding unit. When the mux file and the ".bifs/.od" file are input to the MP4 encoding unit 280, the ".mp4" bitstream file 290 is generated and then visualized by the MPEG-4 player. This method will now be described in greater detail with reference to Embodiment 1.

Embodiment 1 that is an example of an XMT file describing transmission of a bitstream of already compressed 3D mesh information using the "BitWrapper" node, is as follows:

```
. . .
<Header>
<InitialObjectDescriptor objectDescriptorID="1" binaryID="1">
    <Descr>
        <esDescr>
            <ES_Descriptor ES_ID="xyz" binaryID="201"
            OCR_ES_ID="xyz">
                . . .
                <StreamSource url=" BufferWithoutEP.bif">
                </StreamSource>
            </ES_Descriptor>
        </esDescr>
    </Descr>
</InitialObjectDescriptor>
</Header>
<Body>
    <Replace>
    <Scene>
        <Group>
            <children>
                <Shape>
                    <geometry>
                    <BitWrapper type="0" buffer=
                    "opt-eight-npf-10-2-12-0.m3d">
                        <node>
                            <IndexedFaceSet>
                                <coord>
                                    <Coordinate></Coordinate>
                                </coord>
                                    <normal>
                                    <Normal></Normal>
                                    </normal>
                            </IndexedFaceSet>
                        </node>
                    </BitWrapper>
                    </geometry>
                </Shape>
            </children>
        </Group>
    </Scene>
    </Replace>
</Body>
. . .
```

As shown in Embodiment 1, when receiving the XMT file that defines transmission of the bitstream of the already compressed 3D mesh information to the buffer using the BitWrapper node, the XMT parser 210 makes input files, i.e., the scene and mux files, which are input to the MPEG-4 encoding unit according to the XMT-A schema regarding the BitWrapper node and encoding parameters, the XMT2BIFS style sheet, and the XMT2MUX style sheet, as follows:

```
- BufferWithoutEP.scene file -
...
    BitWrapper {
                    node IndexedFaceSet {
                        coord Coordinate { }
                        normal Normal { }
                    }
                    type 0
                    buffer " opt-eight-npf-10-2-12-0.m3d"
    }
...
- BufferWithoutEP.mux file -
    InitialObjectDescriptor {
...
        muxInfo MuxInfo{
            fileName "BufferWithoutEP.bif"
            streamFormat BIFS
        }
    }
```

When the scene and mux files are input to the BIFS encoding unit 270 that is the MPEG-4 encoding unit, a ".bifs/.od" file is output from the BIFS encoding unit 270. The ".bifs/.od" file and the mux file are input to the MP4 encoding unit 280, an ".mp4" bitstream is output from the MP4 encoding unit 280. The "mp4" file is visualized by the MPEG-4 player.

(2) A method of transmitting an already compressed bitstream to a URL according to an embodiment of the present invention will be described with reference to FIGS. 2 and 7.

Figure 7:
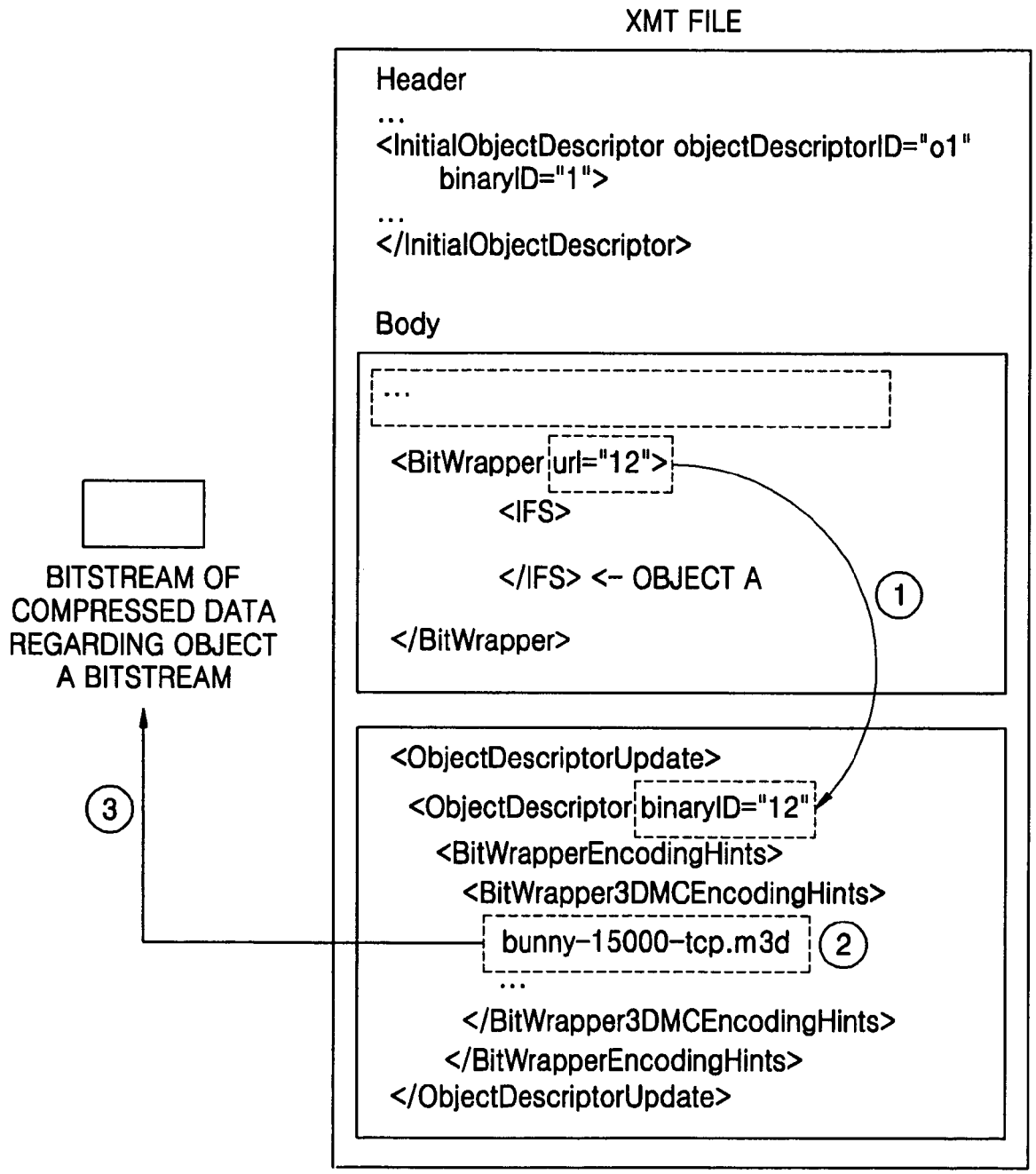
FIG. 7 illustrates an example of transmission of a bitstream of already compressed 3D graphics data of an object A in a BitWrapper node, using a Uniform Resource Locator (URL), according to an embodiment of the present invention.

FIG. 7 illustrates a method of transmitting an already compressed bitstream of 3D graphics data, such as geometry information, connection information, and color information, regarding an object A, e.g., a cup, in the BitWrapper node to the URL.

In this method, first, an object descriptor that has binary ID, as a field, whose value, e.g., 12, is equal to that of URL ID described in the URL field in the compression node (BitWrapper node), is updated, indicated by an arrow ① of FIG. 7. Next, an already compressed bitstream name defined in BitWrapperEncodingHints in the object descriptor is detected such as ②. Next, the already compressed bitstream is transmitted to the already compressed bitstream name, indicated by an arrow ③.

As shown in FIG. 2, when the XMT file 200 is input to the XMT parser 210, the XMT parser 210 inserts the transmitted already compressed bitstream together with scene data into a bitstream regarding a scene and transmits the bitstream regarding the scene, according to the XMT schema 230 and using the XMT2BIFS style sheet 240 and the XMT2MUX style sheet 220.

The XMT file 200 consists of a header that has an InitialObjectDescriptor; and a body that has at least one compression node and an ObjectDescriptorUpdate with at least one objectDescriptor. The InitialObjectDescriptor includes StreamSource defining the name of a file output from the BIFS encoding unit 270, decoding information regarding decoding of the compressed file from BIFS encoding unit and synchronization information regarding a time sequence in which graphics objects are displayed. The compression node of the body includes URL ID that is equivalent to those of ObjectDescriptor of ObjectDescriptorUpdate including the name of a file storing the bitstream of already compressed object data. The objectDescriptor included in the ObjectDescriptorUpdate corresponds to objectDescriptor ID, includes, as a field, binary ID whose value is equal to that of the URL ID of compression node in the body, and AFXConfig being information regarding decoding of the compressed object data and BitWrapperEncodingHints defining a name of a file storing the bitstream of the compressed object data and type of compression format of the compressed bitstream.

The scene file includes at least one compression node that is equivalent to those of the body; and an ObjectDescriptorUpdate that has ObjectDescriptor contataining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body. The mux file includes an InitialObjectDescriptor and an objectDescriptor that are equivalent to those of ObjectDescriptorUpdate in the body. The mux file contains a .bifs/.od file generated by the BIFS encoding unit 270 that is an MPEG-4 encoding unit. When the mux file and the .bifs/.od file are input to the MP4 encoding unit 280, the ".mp4" bitstream file 290 is generated and then visualized by the MPEG-4 player. This method will be described in great detail with reference to Embodiment 2.

Embodiment 2 that is an example of an XMT file describing transmission of a bitstream of already compressed 3D mesh information to the URL using the "BitWrapper" node, is as follows:

```
<Header>
    <InitialObjectDescriptor objectDescriptorID="1" binaryID="1">
        <Descr>
                <esDescr>
                    <ES_Descriptor ES_ID="xyz" binaryID="201" OCR_ES_ID="xyz">
                        ...
                        <StreamSource url="URLWithoutEP.od">
                        </StreamSource>
                    </ES_Descriptor>
                </esDescr>
        </Descr>
        <Descr>
                <esDescr>
                    <ES_Descriptor ES_ID="xyz1" binaryID="301"
                    OCR_ES_ID="xyz1">
                        ...
                        <StreamSource url="URLWithoutEP.bif">
```

-continued

```
                </StreamSource>
            </ES_Descriptor>
        </esDescr>
    </Descr>
</InitialObjectDescriptor>
</Header>
<Body>
    <Replace>
        <Scene>
            <Group>
                <children>
                    <Shape>
                        <geometry>
                            <BitWrapper type="0" URL="12">
                                <node>
                                    <IndexedFaceSet>
                                        <coord >
                                            <Coordinate> </Coordinate>
                                        </coord>
                                        <normal>
                                            <Normal></Normal>
                                        </normal>
                                    </IndexedFaceSet>
                            </BitWrapper>
                        </geometry>
                    </Shape>
                </children>
            </Group>
        </Scene>
    </Replace>
    <ObjectDescriptorUpdate>
        <OD>
            <ObjectDescriptor objectDescriptorID="o2" binaryID="12">
                <Descr>
                    <esDescr>
                        <ES_Descriptor ES_ID="PI" binaryID="211" OCR_ES_ID="PIC">
                            <decConfigDescr>
                                <DecoderConfigDescriptor
                                            streamType="3"
                                            objectTypeIndication="5"
                                            bufferSizeDB="50000">
                                    <decSpecificInfo>
                                        <AFXConfig>
                                            <A3DMCDecoderSpecific>
                                            </A3DMCDecoderSpecific>
                                        </AFXConfig>
                                    </decSpecificInfo>
                                </DecoderConfigDescriptor>
                            </decConfigDescr>
                            <StreamSource>
                                <BitWrapperEncodingHints>
                                    <BitWrapper3DMCEncodingHints>
                                        <sourceFormat>
                                            <param value="bunny-15000-tcp.m3d"> </param>
                                        </sourceFormat>
                                        <targetFormat></targetFormat>
                                    </BitWrapper3DMCEncodingHints>
                                </BitWrapperEncodingHints>
                            </StreamSource>
                        </ES_Descriptor>
                    </esDescr>
                </Descr>
            </ObjectDescriptor>
        </OD>
    </ObjectDescriptorUpdate>
</Body>
```

As disclosed in Embodiment 2, upon receiving the XMT file describing transmission of the already-compressed bitstream of 3D mesh information to the URL using the "BitWrapper" node, the XMT parser 210 makes input files, such as the scene and mux files, which can be input to the MPEG-4 encoding unit based on the XMT schema 230 and the XMT2BIFS and XMT2MUX style sheets, as follows:

- URLWithoutEP.scene file -

. . .
```
BitWrapper {
    node IndexedFaceSet {
        coord Coordinate { }
        normal Normal { }
```

```
}
type 0
URL 12
}
...
UPDATE OD [
ObjectDescriptor {
        objectDescriptorID 12
        muxScript URLWithoutEP.mux
}
]
- URLWithoutEP.mux file -
    ...
ObjectDescriptor {
    objectDescriptorID 12
        esDescr [
            ES_Descriptor {
                ES_ID 211
            decConfigDescr DecoderConfigDescriptor
            {
                streamType 3
                objectTypeIndication 5
                bufferSizeDB 50000
                decSpecificInfo AFXConfig
                {
                    afxext A3DMCDecoderSpecific { }
                }
            }
            ...
                muxInfo MuxInfo{
                    fileName "bunny-15000-tcp.m3d"
                    stream Format 3DMC
                    }
...
```

The above ".scene" and ".mux" files are input to the MPEG-4 encoding unit. The ".scene" file is input to the BIFS encoding unit 270 to generate the ".bifs/.od" file. The ".bifs/.od" and ".mux" files are input to the MP4 encoding unit 280 to generate the ".mp4" bitstream file 290. The ".mp4" bitstream file is visualized by the MPEG-4 player.

(3) When uncompressed object data is encoded into a bitstream using encoding parameters and the bitstream is transmitted to a buffer:

A method of encoding object data into a bitstream using encoding parameters and transmitting the bitstream to a buffer according to an embodiment of the present invention will now be described with reference to FIGS. 2 and 8.

Figure 8:
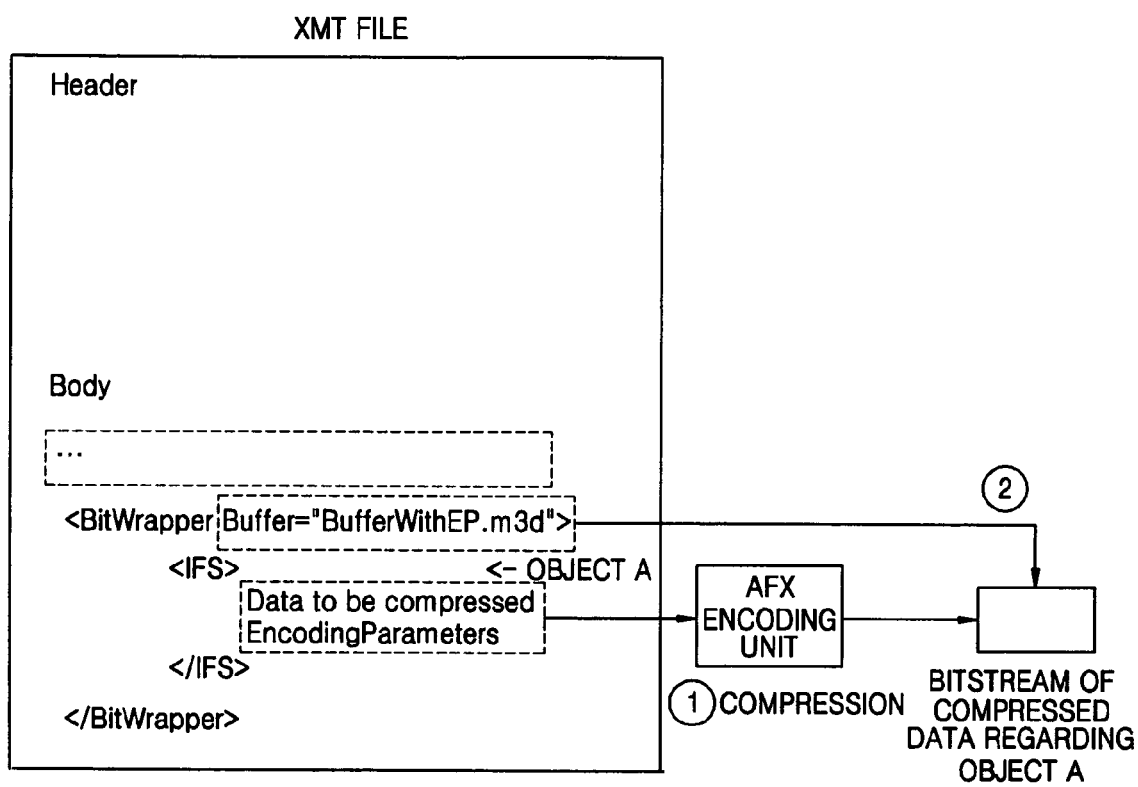
FIG. 8 illustrates an exemplary method of compressing 3D graphics data regarding the object A into a bitstream using parameters and transmitting the bitstream using a buffer.

Referring to FIG. 8, 3D object data, e.g., geometry information, connection information, and color information, regarding an object A such as a cup is compressed into a bitstream by the AFX encoding unit 260 using encoding parameters, indicated by an arrow ① of FIG. 8. The compressed bitstream is transmitted to the name, i.e., "BufferWithEP.m3d", of a compressed bitstream defined in a buffer field of the compression node, indicated by an arrow ②.

As shown in FIG. 2, when the XMT file 200 is input to the XMT parser 210, the XMT parser 210 inserts the compressed bitstream together with scene data into a bitstream regarding a scene and transmits the bitstream regarding the scene, according to the XMT schema 230 and using the XMT2MUX and XMT2BIFS styles sheets 220 and 240. The XMT file 200 consists of a header having an InitialObjectDescriptor, and a body having at least one compression node. The InitialObjectDescriptor of the header includes StreamSource presenting the name of a file output from the BIFS encoding unit 270, decoding information regarding decoding of the compressed file from BIFS encoding unit and synchronization information regarding a time sequence in which graphics objects are displayed. The compression node of the body includes a node field storing the name of a node that is to be compressed, object data that is included in the node field and will be compressed, encoding parameters for compressing the object data, and a buffer field storing the name of a bitstream of the object data compressed using the encoding parameters.

The scene file includes at least one compression node equivalent to that of the body. The mux file includes an InitialObjectDescriptor that is equivalent to that of the header, and information regarding the stream format of a file that is included in the InitialObjectDescriptor and output from the BIFS encoding unit 270. When the mux and scene files are input to the AFX encoding unit 260, object data contained in the scene file is compressed and modified mux and scene files are generated.

Compression of the object data will be described in greater detail. If it is determined that graphics data is not compressed, object data and encoding parameters defined in the compression node of the scene file are stored. The object data and encoding parameters are transmitted to a predetermined encoding unit that matches the type of graphics object data in the node field of the compression node that defines the stored object data. The object data is compressed into a bitstream using the encoding parameters.

The modified mux file contains a .bifs/.od file generated by the BIFS encoding unit 270 that is an MPEG-4 encoding unit. When the modified mux file and the .bifs/.od file are input to the MP4 encoding unit 280, the mp4 file 290 is generated and then visualized by the MPEG-4 player. This method will now be described in greater detail with reference to Embodiment 3.

Embodiment 3 that is an example of an XMT file describing compression of the original 3D mesh information into a bitstream using the encoding parameters and transmission of the bitstream to a buffer using the "BitWrapper" node, is as follows:

```
<Header>
    <InitialObjectDescriptor objectDescriptorID="1" binaryID="1">
        <Descr>
            <esDescr>
                <ES_Descriptor ES_ID="xyz" binaryID="201"
                OCR_ES_ID="xyz">
                    ...
                    <StreamSource url="3DMC_npf_BufferWithEP.bif">
                    </StreamSource>
                </ES_Descriptor>
            </esDescr>
        </Descr>
    </InitialObjectDescriptor>
```

-continued

```
        </Header>
        <Body>
        ...
            <BitWrapper type="0" buffer="opt-eight-npf-10-9-2-0.m3d">
                <node>
                    <IndexedFaceSet ccw="TRUE" solid="TRUE"
                        coordIndex="0, 1, 2, -1, 3, 4, 5, -1, ... "
                        normalPerVertex="TRUE">
                        <coord DEF="Box-COORD">
                            <Coordinate point="0 1 2, 0 2 3, 4 0 1, 1 5 4, 5 1 2, 2 6
5, ... "></Coordinate>
                        </coord>
                        <normal>
                            <Normal vector="0.7859 -0.341 -0.5157, 0.3812 -0.801
0.4615, ... "></Normal>
                        </normal>
                    </IndexedFaceSet>
                </node>
                <IndexedFaceSetEncodingParameter coordQBits="10" normalQBits="9"
coordPredMode="2 normalPredMode="0" errorResilience="OFF">
                </IndexedFaceSetEncodingParameter>
            </BitWrapper>
            ...
        <Body>
```

When receiving the XMT file that defines compression of 3D mesh information in the BitWrapper node using the encoding parameters, the XMT parser 210 outputs the scene file containing the 3D mesh information, the encoding parameters, and information regarding a scene defined in the BitWrapper node; and the mux file containing information regarding transmission of the object data or synchronization thereof with other data, based on the XMT schema 230 and the XMT2MUX and XMT2BIFS style sheets 220 and 240.

```
- 3DMC_npf_BufferWithEP.scene file -
    ...
    BitWrapper {
        node IndexedFaceSet {
            ccw="TRUE"
            solid="TRUE"
            coodIndex="0, 1, 2, -1, 3, 4, 5, -1, ... "
            normalPerVertex="TRUE"
            coord DEF Box-COORD Coordinate {
                point [0 1 2, 0 2 3, 4 0 1, 1 5 4,
                    5 1 2, 2 6 5, ... ]
            }
            normal Normal {
                Vector[0.7859, -0.341, -0.5157,
                    0.3812, -0.801, 0.4615, ... ]
            }
        }
        IndexedFaceSetEncodingParameter{
            coordQBits 10
            NormalQBits 9
            coordPredMode 2
            normalPredMode 0
            errorResilience OFF
        }
        type 0
        buffer "opt-eight-npf-10-9-2-0.m3d"
    }
    ...
    - "3DMC_npf_BufferWithEP.mux" file -
    InitialObjectDescriptor {
        ...
        muxInfo MuxInfo{
            fileName "3DMC_npf_BufferWithEP.bif"
            streamFormat BIFS
        }
    }
}
```

However, the scene and mux files cannot be input to the MPEG-4 encoding unit. Thus, the scene and mux files are input to the AFX encoding unit 260, and converted into \_modified.scene and \_modified.mux files that can be input to the MPEG-4 encoding unit as follows, respectively. Also, the 3D mesh information is compressed into a bitstream.

```
- 3DMC_npf_BufferWithEP_modified.scene file -
    ...
    BitWrapper {
        node IndexedFaceSet {
            coord Coordinate { }
            normal Normal { }
        }
        type 0
        buffer "bunny-15000-tcp.m3d"
    }
    ...
    - 3DMC_npf_BufferWithEP_modified.mux file -
    InitialObjectDescriptor {
        ...
        muxInfo MuxInfo{
            fileName "3DMC_npf_BufferWithEP_modified.bif"
            streamFormat BIFS
        }
    }
```

The \_modified.scene file output from the AFX encoding unit 260 is input to the BIFS encoding unit 270 that is the MPEG-4 player, and a bifs/od file is generated. When the bifs/od file and the \_modified.mux file are input to the MP4 encoding unit 280, the mp4 bitstream file 290 is generated. The mp4 bitstream file is visualized by the MPEG-4 player.

(4) When the original data is compressed into a bitstream using the encoding parameters and the bitstream is transmitted to the URL:

A method of compressing the original data into a bitstream using the encoding parameters and transmitting the bitstream to the URL, according to an embodiment of the present invention, will now be described with reference to FIGS. 2 and 9.

Figure 9:
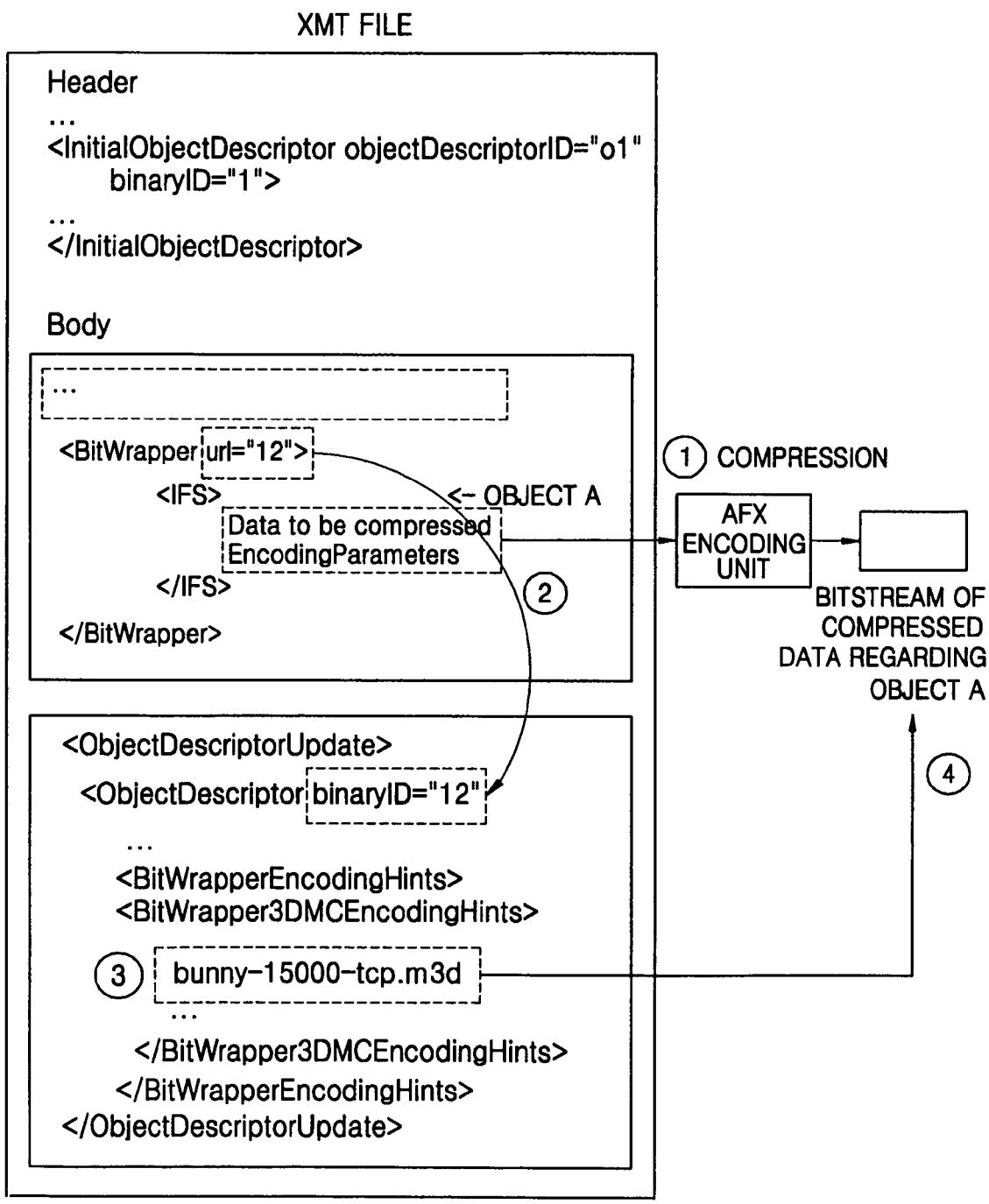
FIG. 9 illustrates an exemplary method of compressing 3D graphics data regarding the object A into a bitstream in a BitWrapper node using parameters and transmitting the bitstream using a URL.

FIG. 9 illustrates a method of compressing 3D object data, such as geometrical data, connection data, and color data, regarding an object A, e.g., a cup, into a bitstream in the BitWrapper node by the AFX encoding unit 260 using the encoding parameters, and transmitting the bitstream to the URL.

In this method, 3D object data in a node field of the BitWrapper node is compressed into a bitstream by the AFX encoding unit 260 using the encoding parameters, indicated by an arrow ①. Next, an object descriptor that has binary ID, as a field, whose value is equal to the value, e.g., 12, of the URL ID defined in the URL field in the compression node is detected such as ②. Next, the name of a bitstream defined in BitWrapperEncodingHints in the detected object descriptor is detected, indicated by an arrow ③. Thereafter, the bitstream compressed by the AFX encoding unit 260 is transmitted to the detected name of the bitstream in BitWrapperEncodingHints, indicated by an arrow ④.

As shown in FIG. 2, when the XMT file 200 is input to the XMT parser 210, the XMT parser makes a mux file and a scene file according to the XMT schema 230, using the XMT2MUX and XMT2BIFS style sheets 220 and 240. When it is determined that the object data in the node fields of the compression nodes of the scene and mux files are not compressed by the AFX encoding unit 260, the object data are compressed into bitstreams using encoding parameters that match the object data and the bitstreams are transmitted to the MP4 encoding unit 280 via the URL. Also, the AFX encoding unit 260 makes input files, i.e., modified scene and mux files, that can be input to the BIFS encoding unit 270 and the MP4 encoding unit 280, respectively. The BIFS encoding unit 270 receives the modified scene file containing scene information and information allowing connection to the mux file that contains the name of a file storing the bitstream obtained by compressing the object data by the AFX encoding unit 260, inserts the scene file into a .bifs/.od bitstream file regarding a scene, and transmits the .bifs/.od bitstream file to the MP4 encoding unit 280. Next, the MP4 encoding unit 280 receives and multiplexes the modified mux file that includes the name of a file in which the bitstream of the object data compressed by the AFX encoding unit 260 will be stored, the compressed bitstream, and the .bifs/.od bitstream file output from the BIFS encoding unit 270, and outputs the result of multiplexing as the .mp4 file 290.

The XMT file 200 consists of a header that includes an InitialObjectDescriptor, and a body that includes at least one compression node and an ObjectDescriptorUpdate that has at least one objectDescriptor.

The InitialObjectDescriptor of the header includes StreamSource defining the name of a file output from the BIFS encoding unit 270, decoding information regarding decoding of the compressed file from BIFS encoding unit and synchronization information regarding a time sequence in which graphics objects are displayed. The compression node of the body includes a node field storing the name of a node that is to be compressed, object data that included in the node field and to be compressed, encoding parameters for compressing the object data, and a field storing URL ID that is equivalent to those of ObjectDescriptor of ObjectDescriptorUpdate including BitWrapperEncodingHints that contatins a name of a file in which the bitstream of the object data compressed using the encoding parameters will be stored.

The objectDescriptor included in an ObjectDescriptorUpdate of the body includes binary ID, as a field, that has a value that is equal to that of the URL ID of compression node in the body, and AFXConfig being information regarding decoding of the compressed object data; and BitWrapperEncodingHints defining a name of a file storing the bitstream of the compressed object data and stream format of the bitstream.

The scene file includes at least one compression node that is equivalent to those of the body; and an ObjectDescriptorUpdate that has ObjectDescriptor contatining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file includes an InitialObjectDescriptor and an objectDescriptor that are equivalent those of ObjectDescriptorUpdate in the body. Also, the mux file contains a .bifs/.od file generated by the BIFS encoding unit 270 that is an MPEG-4 encoding unit, and the name, i.e., "bunny-15000-tcp.m3d", of a file containing the compressed bitstream of the object A.

The mux and scene files are input to the AFX encoding unit 260, the object data in the scene file is compressed and modified mux and scene files are generated.

Compression of the object data into the bitstream will now be described. When it is determined that graphics data is not compressed, object data and encoding parameters in the compression node of the scene file are stored. Next, the object data and the encoding parameters are transmitted to a predetermined encoding unit that matches the type of graphics object data in the node field of the compression node that stores the object data. Next, the object data is compressed into a bitstream using the encoding parameters.

The modified mux file contains the .bifs/.od file generated by the BIFS encoding unit 270 that is an MPEG-4 encoding unit. The modified mux file and the .bifs/.od file are input to the MP4 encoding unit 280 to generate the .mp4 file 290. The .mp4 file 290 is displayed on the MPEG-4 player. This method will now be described in greater detail with reference to Embodiment 4.

Embodiment 4 that is an example of an XMT file describing compression of the original 3D mesh information into a bitstream using the encoding parameters and transmission of the bitstream to the URL, using the "BitWrapper" node, is as follows:

```
<Header>
    ...
    <InitialObjectDescriptor objectDescriptorID="1" binaryID="1" >
        <Descr>
            <esDescr>
                <ES_Descriptor ES_ID="xyz" binaryID="201" OCR_ES_ID="xyz">
                    ...
                    <StreamSource url="3DMC_npf_URLWithEP.od">
                    </StreamSource>
                </ES_Descriptor>
            </esDescr>
        </Descr>
        <Descr>
            <esDescr>
                <ES_Descriptor ES_ID="xyz1" binaryID="301" OCR_ES_ID="xyz1">
```

```
                    . . .
                    <StreamSource url="3DMC_npf_URLWithEP.bif">
                    </StreamSource>
                </ES_Descriptor>
            </esDescr>
        </Descr>
    </InitialObjectDescriptor>
</Header>
<Body>
    <Replace>
        <Scene>
            <Group>
                <children>
                    <Shape>
                        <geometry>
                            <BitWrapper type="0" URL="12">
                                <node>
                                    <IndexedFaceSet ccw="TRUE" solid="TRUE"
                                                    coordIndex="0,1,2,-1,3,4,5,-1, . . . "
                                                    normalPerVertex="TRUE">
                                        <coord DEF="Box-COORD">
                                            <Coordinate point="012,023,401,154,512,265, . . . ">
                                        </Coordinate>
                                        </coord>
                                        <normal>
                                            <Normal vector="0.7859 −0.341 −0.5159, 0.3821 −0.801
0.4615, . . . "> </Normal>
                                        </normal>
                                    </IndexedFaceSet>
                                </node>
                                <IndexedFaceSetEncodingParameter coordQits="10"
                                                normalQBits="9" coordPreMode="2"
                                                normalPredMode="0" errorResilience="OFF">
                                </IndexedFaceSetEncodingParameter>
                            </BitWrapper>
                        </geometry>
                    </Shape>
                </children>
            </Group>
        </Scene>
    </Replace>
    <ObjectDescriptorUpdate>
        <OD>
            <ObjectDescriptor objectDescriptorID="o2" binaryID="12">
                <Descr>
                    <esDescr>
                        <ES_Descriptor ES_ID="PI" binaryID="211" OCR_ES_ID="PIC">
                            . . .
                            <decConfigDescr>
                                <DecoderConfigDescriptor
                                    streamType="3"
                                    objectTypeIndication="5"
                                    bufferSizeDB="50000">
                                    <decSpecificInfo>
                                        <AFXConfig>
                                            <A3DMCDecoderSpecific> </A3DMCDecoderSpecific>
                                        </AFXConfig>
                                    </decSpecificInfo>
                                </DecoderConfigDescriptor>
                            </decConfigDescr>
                            . . .
                            <StreamSource>
                                <BitWrapperEncodingHints>
                                    <BitWrapper3DMCEncodingHints>
                                        <sourceFormat>
                                            <param value="opt-eight-npf-10-9-2-0.m3d"> </param>
                                        </sourceFormat>
                                        <targetFormat> </targetFormat>
                                    </BitWrapper3DMCEncodingHints>
                                </BitWrapperEncodingHints>
                            </StreamSource>
                        </ES_Descriptor>
                    </esDescr>
                </Descr>
            </ObjectDescriptor>
        </OD>
    </ObjectDescriptorUpdate>
</Body>
```

When receiving the XMT file that defines compression of 3D mesh information in the BitWrapper node using the encoding parameters, the XMT parser 210 outputs the scene file containing the 3D mesh information, the encoding parameters, and scene information in the BitWrapper node, and outputs the mux file containing information regarding transmission of the object data or synchronization thereof with other data, based on the XMT schema 230 and the XMT2MUX and XMT2BIFS style sheets 220 and 240.

```
- 3DMC_npf_URLWithEP.scene file -
    ...
    geometry BitWrapper {
            node IndexedFaceSet {
                        ccw TRUE
                        coordIndex [0, 1, 2, -1, 3, 4, 5, -1, . . . ]
                        normalPerVertex TRUE
                        solid TRUE
                        coord DEF Box-COORD Coordinate {
                            point [012, 023, 401, 154, 512, 265, . . . ]
                        }
                        normal Normal {
                            vector [0.7859, -0.341, -0.5159, 0.3821, -0.801,, 0.4651 . . . ]
                        }
            }
            IndexedFaceSetEncodingParameter{
                        coordQBits 10
                        normalQBits 9
                        coordPredMode 2
                        normalPredMode 0
                        errorResilience OFF
            }
            type 0
            URL 12
    }
    UPDATE OD [
    ObjectDescriptor {
                        objectDescriptorID 12
                        muxScript 3DMC_npf_URLWithEP.mux
    }
]
        - 3DMC_npf_URLWithEP.mux file -
        ...
    ObjectDescriptor {
            objectDescriptorID 12
            esDescr [
                ES_Descriptor {
                    ES_ID 211
                    decConfigDescrDecoderConfigDescriptor
                    {
                        streamType 3
                        objectTypeIndication 5
                        bufferSizeDB 50000
                        decSpecificInfo      AFXConfig
                        {
                            afxext A3DMCDecoderSpecific { }
                        }
                    }
                    ...
                    muxInfo MuxInfo{
                            fileName "opt-eight-npf-10-9-2-0.m3d"
                            streamFormat 3DMC
                    }
                }
            ]
    }
```

However, the scene and mux files cannot be input to the MPEG-4 encoding unit. Thus, the scene and mux files are input to the AFX encoding unit 260 so that they are converted into _modified.scene and _modified.mux files that can be input to the MPEG-4 encoding unit as follows. Also, the 3D mesh information is compressed into a bitstream.

```
- 3DMC_npf_URLWithEP_modified.scene file -
...
geometry BitWrapper {
        node IndexedFaceSet {
                    coord Coordinate { }
                    normal Normal { }
        }
        type 0
        URL 12
```

-continued

```
}
UPDATE OD [
    ObjectDescriptor {
                    objectDescriptorID 12
```

```
        muxScript URLWithEP_modified.mux
    }
]
    - 3DMC_npf_URLWithEP_modified.mux file -
...
ObjectDescriptor {
    objectDescriptorID 12
    esDescr [
        ES_Descriptor {
            ES_ID 211
            decConfigDescr DecoderConfigDescriptor
            {
                streamType 3
                objectTypeIndication 5
                bufferSizeDB 50000
                decSpecificInfo AFXConfig
                {
                    afxext A3DMCDecoderSpecific { }
                }
            }
            ...
            muxInfo MuxInfo{
                    fileName "opt-eight-npf-10-9-2-0.m3d"
                    streamFormat 3DMC
                }
        ]
    }
```

The _modified.scene and _modified.mux files are input to the BIFS encoding unit 270 that is the MPEG-4 encoding unit to generate a bifs/od file. When the bifs/od file and the modified mux file are input to the MP4 encoding unit 280, an mp4 bitstream file is generated. The mp4 bitstream file is visualized by the MPEG-4 player.

(5) When object data is compressed into a bitstream using encoding parameters and the bitstream is transmitted to either the buffer or the URL:

As shown in FIG. 2, when the XMT file 200 is input to the XMT parser 210, the XMT parser 210 makes a mux file and a scene file according to the XMT schema 230, using the XMT2MUX and XMT2BIFS style sheets 220 and 240. When it is determined that the object data included in node fields of compression nodes of the mux and scene files are not compressed by the AFX encoding unit 260, the object data are compressed into bitstreams using encoding parameters that match the object data and the bitstream is transmitted to the MP4 encoding unit 280 via the buffer or the URL. Also, the AFX encoding unit 260 makes input files, i.e., modified scene and mux files, that can be input to the BIFS encoding unit 270 and the MP4 encoding unit 280. The BIFS encoding unit 270 receives the modified scene file that contains scene information, and information that allows connection to the mux file containing the name of a file in which the bitstream of the object data compressed by the AFX encoding unit 260 will be stored (when transmitting the bitstream to the buffer) and the name of a file in which the bitstream of the object data compressed by the AFX encoding unit 260 will be stored (when transmitting the bitstream to the URL). The scene file is inserted into a bifs/od bitstream regarding a scene and the bifs/od bitstream is transmitted to the MP4 encoding unit 280. The MP4 encoding unit 280 receives and multiplexes the modified mux file containing the name of the file in which the bitstream of the object data compressed by the AFX encoding unit 260 will be stored, the compressed bitstream, and the bifs/od bitstream output from the BIFS encoding unit 270, and outputs the result of multiplexing as the .mp4 file 290.

The XMT file consists of a header that includes an InitialObjectDescriptor; and a body that includes at least one compression node with a buffer field, at least one compression node with an URL field, and an ObjectDescriptorUpdate that has objectDescriptors, the number of which is equal to that of the at least one compression node with the URL field.

The InitialObjectDescriptor of the header includes StreamSource defining the name of a file output from the BIFS encoding unit 270, decoding information regarding decoding of the compressed file from BIFS encoding unit and synchronization information regarding a time sequence in which graphics objects are displayed. The compression node of the body that has the buffer field in the body includes a node field defining the name of a node that will be compressed, object data that is included in the node field and will be compressed, encoding parameters for compressing the object data, and the buffer field defining the name of the bitstream of the object data compressed using the encoding parameters. The compression node of the body that has the URL field includes a node field defining the name of a node that will be compressed, object data that is included in the node field and will be compressed, encoding parameters for compressing the object data, and a field defining URL ID that is equivalent to those of ObjectDescriptor of ObjectDescriptorUpdate including BitWrapperEncodingHints that contatins the name of a file in which the bitstream of the object data compressed using the encoding parameters will be stored. The objectDescriptor of an ObjectDescriptorUpdate in the body includes binary ID, as a field, that has the same value as the URL ID of compression node in the body, and.AFXConfig being information regarding decoding of the compressed object data and BitWrapperEncodingHints defining a name of a file storing the bitstream of the compressed object data and type of compression format of the compressed bitstream, The scene file includes a compression node that is equivalent to those of the body; and an ObjectDescriptorUpdate that has ObjectDescriptor contatining url Identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file includes an InitialObjectDescriptor and an objectDescriptor that are equivalent to those of ObjectDescriptorUpdate in the body.

It is determined whether the scene file contains uncompressed graphics object data. When it is determined that the graphics object data is compressed, a .bifs/.od bitstream output from the BIFS encoding unit 270 that is an MPEG-4 encoding unit is included in the mux file. When the mux file and the bifs/.od bitstream are input to the MP4 encoding unit 280, the mp4 file 290 is generated. The mp4 file 290 is displayed on a monitor of the MPEG-4 player.

When it is determined that the graphics object data is not compressed, the mux and scene file are input to the AFX encoding unit 260 so that the object data in the scene file is compressed and modified mux and scene files are generated.

The compression of the object data will be described in greater detail. If it is determined that the graphics object data is not compressed, the object data and encoding parameters in the compression node of the scene file are stored. The object data and the encoding parameters are transmitted to a predetermined encoding unit that matches the type of a graphics object in a node field of a compression node that contains the stored object data. Next, the object data is compressed into a bitstream using the encoding parameters.

The modified mux file contains the .bifs/.od bitstream generated by the BIFS encoding unit 270 that is an MPEG-4 encoding unit. The modified mux file and the .bifs/.od bitstream are input to the MP4 encoding unit 280, the mp4 file 290 is generated. The mp4 file 290 is visualized by the MPEG-4 player.

The following is Embodiment 5 that is an example of an XMT file describing compression of the original data into a bitstream using the encoding parameters and transmission of the bitstream to the buffer or the URL, using the "BitWrapper" node. Here, the original data is 3D bar animation data that includes rotation keyframe animation data and positional keyframe animation data. The rotation keyframe animation data and the motion keyframe animation data are included in the BitWrapper nodes, respectively.

```
<Header>
    <InitialObjectDescriptor objectDescriptorID="o1" binaryID="1" >
        <Descr>
        <esDescr>
            <ES_Descriptor ES_ID="xyz" binaryID="201">
                <decConfigDescr >
                    <DecoderConfigDescriptor
                        streamType="1"
                        objectTypeIndication="2"
                        bufferSizeDB="10000000">
                    </DecoderConfigDescriptor>
                </decConfigDescr>
                <slConfigDescr>
                    <SLConfigDescriptor>
                        <custom timeStampResolution="100"/>
                    </SLConfigDescriptor>
                </slConfigDescr>
                <StreamSource url=" MB-BufferURLWithEP7.od">
                </StreamSource>
            </ES_Descriptor>
        </esDescr>
        <esDescr>
            <ES_Descriptor ES_ID="xyz1" binaryID="301">
                <decConfigDescr >
                    <DecoderConfigDescriptor
                        streamType="3"
                        objectTypeIndication="2"
                        bufferSizeDB="500000">
                        <decSpecificInfo>
                            <BIFSv2Config nodeIDbits="10">
                                <commandStream pixelMetric="true"></commandStream>
                            </BIFSv2Config>
                        </decSpecificInfo>
                    </DecoderConfigDescriptor>
                </decConfigDescr>
                <slConfigDescr>
                    <SLConfigDescriptor>
                        <custom timeStampResolution="100"
                                timeStampLength="14" />
                    </SLConfigDescriptor>
                </slConfigDescr>
                <StreamSource url=" MB-BufferURLWithEP7.bif">
                </StreamSource>
            </ES_Descriptor>
        </esDescr>
        </Descr>
    </InitialObjectDescriptor>
</Header>
<Body>
    <BitWrapper type="0"
    buffer="Box01-POS-INTERP__14__16__0__bbb__keycoder__key__noquant__intra__1dpcm.aac
    ">
        <node>
            <PositionInterpolator DEF="Box01-POS-INTERP"
                        key="0, 0.4301, 0.4409, 0.4516, 0.4624, 0.4731, . . . "
                        keyValue="0.0008889 0.2705 0, . . . " />
        </node>
        <PositionInterpolatorEncodingParameter keyQBits="14" keyValueQBits="16"/>
    </BitWrapper>
    <BitWrapper type="0" URL="12">
        <node>
            <OrientationInterpolator DEF="Box01-ROT-INTERP"
                    key="0, 0.01075, 0.02151, 0.03226, 0.04301, . . . "
                keyValue="1 0 0 0, 0.9692 0.2461 0.001842 −0.01544, . . . "/>
        </node>
        <OrientationInterpolatorEncodingParameter keyQBits="16"
                                                  keyValueQBits="16"/>
    </BitWrapper>
    <ObjectDescriptorUpdate>
        <OD>
```

-continued

```
<ObjectDescriptor objectDescriptorID="o2" binaryID="12">
    <Descr>
<esDescr>
                    <ES_Descriptor ES_ID="PI" binaryID="211">
                                <decConfigDescr>
                            <DecoderConfig Descriptor
                                            streamType="3"
                                            objectTypeIndication="5"
                                            bufferSizeDB="50000">
                                        <decSpecificInfo>
                                            <AFXConfig>
                                                <OriInterpCompDecoderSpecific>
                                                </OriInterpCompDecoderSpecific>
                                            </AFXConfig>
                                        </decSpecificInfo>
                                    </DecoderConfigDescriptor>
                                </decConfigDescr>
                    <slConfigDescr>
                                <SLConfigDescriptor>
                                    <custom timeStampResolution="100"/>
                                </SLConfigDescriptor>
                    </slConfigDescr>
                    <StreamSource>
                                <BitWrapperEncodingHints>
                            <BitWrapperICEncodingHints>
                                    <sourceFormat>
                                            <param
value="Box01-ROT-INTERP_16_16_0_bbb_keycoder_key_noquant_smart.aac"/>
                                    </sourceFormat>
                                <targetFormat></targetFormat>
                            </BitWrapperICEncodingHints>
                        </BitWrapperEncodingHints>
                    </StreamSource>
        </ES_Descriptor>
    </esDescr>
    </Descr>
</ObjectDescriptor>
    </OD>
</ObjectDescriptorUpdate>
</Body>
```

When receiving the XMT file 200 that describes compression of the rotational keyframe animation data and the motion keyframe animation data in the BitWrapper node using the encoding parameters, the XMT parser 210 outputs the scene file that contains scene information, the name of a bitstream obtained by compressing the original data using encoding parameters in the BitWrapper node (when transmitting the bitstream to the buffer), and information regarding an ObjectDescriptorUpdate (when transmitting the bitstream to the URL) and the mux file that contains information regarding data transmission or synchronization of the original data with other data, the name of a file output from the BIFS encoding unit 270, and the name of a compressed bitstream when transmitting the bitstream to the URL, according to the XMT schema 230 and using the XMT2MUX and XMT2BIFS style sheets 220 and 240.

```
- MB-BufferURLWithEP7.scene file -
BitWrapper {
            node DEF Box01-POS-INTERP PositionInterpolator {
                key [0, 0.4301, 0.4409, 0.4516, 0.4624, 0.4731, ]
                keyValue [0.0008889 0.2705 0, ]
            }
            PositionInterpolatorEncodingParameter {
                keyQBits 14 keyValueQBits 16
            }
            type 0
            buffer "Box01-POS-
                INTERP_14_16_0_bbb_keycoder_key_noquant_intra_1dpcm.aac"
}
BitWrapper {
            node DEF Box01-ROT-INTERP OrientationInterpolator {
                key [0, 0.01075, 0.02151, 0.03226, 0.04301, . . . ]
                keyValue [1 0 0 0, 0.9692 0.2461 0.001842 −0.01544, . . . ]
            }
            OrientationInterpolatorEncodingParameter {
                        keyQBits        16
                        keyValueQBits   16
            }
```

-continued

```
                    type 0
                    URL 12
        }
    UPDATE OD [
        ObjectDescriptor {
                    objectDescriptorID 12
                    muxScript MB-BufferURLWithEP7.mux
            }
    ]
    - MB-BufferURLWithEP7.mux file
    InitialObjectDescriptor {
        objectDescriptorID 1
        esDescr [
                    ES_Descriptor {
                    ES_ID 201
                        decConfigDescr DecoderConfigDescriptor {
                            objectTypeIndication 2
                            streamType 1
                            bufferSizeDB 10000000
                        }
                        slConfigDescr SLConfigDescriptor {
                                timeStampResolution 100
                        }
                            muxInfo MuxInfo {
                                    fileName "MB-BufferURLWithEP7.od"
                                    streamFormat BIFS
                            }
                    }
        ]
        esDescr [
            ES_Descriptor {
                ES_ID 301
                decConfigDescr DecoderConfigDescriptor {
                    objectTypeIndication 2
                    streamType 3
                    bufferSizeDB 500000
                        decSpecificInfo BIFSv2Config {
                            nodeIDbits 10
                            . . .
                            pixelMetric true
                            slConfigDescr SLConfigDescriptor {
                                    timeStampResolution 100
                                    timeStampLength 14
                            }
                            muxInfo MuxInfo {
                                fileName "MB-BufferURLWithEP7.bif"
                                streamFormat BIFS
                            }
                        }
                }
            }
        ]
    }
    ObjectDescriptor {
        objectDescriptorID 12
        esDescr [
            ES_Descriptor {
                ES_ID 211
                decConfigDescr DecoderConfigDescriptor {
                        objectTypeIndication 5
                        streamType 3
                        bufferSizeDB 50000
                    decSpecificInfo AFXConfig {
                        afxext OriInterpCompDecoderSpecific { }
                    }
                }
                slConfigDescr SLConfigDescriptor {
                    timeStampResolution 100
                }
                muxInfo MuxInfo {
                    fileName
"Box01-ROT-INTERP_16_16_0_bbb_keycoder_key_noquant_smart.aac"
                    streamFormat InterpolatorCompression
                }
            }
        ]
    }
```

However, the above scene and mux files cannot be input to the MPEG-4 encoding unit. Therefore, these files are converted into the following input files that can be input to the MPEG-4 encoding unit using the AFX encoding unit 260, and a compressed bitstream is generated by an encoding unit related to graphics data.

```
- MB-BufferURLWithEP7_modified.scene file -
BitWrapper {
    node DEF Box01-POS-INTERP PositionInterpolator { }
    type 0
    buffer "Box01-POS-
    INTERP_14_16_0_bbb_keycoder_key_noquant_intra_1dpcm.aac"
}
BitWrapper {
    node DEF Box01-ROT-INTERP OrientationInterpolator { }
    type 0
    URL 12
}
    UPDATE OD [
        ObjectDescriptor {
            objectDescriptorID 12
            muxScript MB-BufferURLWithEP7_modified.mux
        }
    ]
-    MB-BufferURLWithEP7_modified.mux file -
InitialObjectDescriptor {
    objectDescriptorID 1
    esDescr [
        ES_Descriptor {
            ES_ID 201
            decConfigDescr DecoderConfigDescriptor {
                objectTypeIndication 2
                streamType 1
                bufferSizeDB 10000000
            }
            slConfigDescr SLConfigDescriptor {
                timeStampResolution 100
            }
            muxInfo MuxInfo {
                fileName "MB-BufferURLWithEP7_modified.od"
                streamFormat BIFS
            }
        }
    ]
    esDescr [
        ES_Descriptor {
            ES_ID 301
            decConfigDescr DecoderConfigDescriptor {
                objectTypeIndication 2
                streamType 3
                bufferSizeDB 500000
                decSpecificInfo BIFSv2Config {
                    nodeIDbits 10
                    ...
                    pixel Metric true
                    slConfigDescr SLConfigDescriptor {
                        timeStampResolution 100
                        timeStampLength 14
                    }
                muxInfo MuxInfo {
                    fileName "MB-BufferURLWithEP7_modified.bif"
                    streamFormat BIFS
                }
            ]
        }
        ObjectDescriptor {
            objectDescriptorID 12
                esDescr [
                    ES_Descriptor {
                        ES_ID 211
                        decConfigDescr DecoderConfigDescriptor {
                            objectTypeIndication 5
                            streamType 3
                            bufferSizeDB 50000
                            decSpecificInfo AFXConfig {
                                afxext OriInterpCompDecoderSpecific { }
                            }
                        }
                        slConfigDescr SLConfigDescriptor {
                            timeStampResolution 100
```

```
            }
        muxInfo MuxInfo {
            fileName
"Box01-ROT-INTERP_16_16_0_bbb_keycoder_key_noquant_smart.aac"
                streamFormat InterpolatorCompression
            }
        }
    ]
}
```

The above _modified.scene is input to the BIFS encoding unit 270 so as to obtain a .bifs/.od bitstream file. When the .bifs/.od bitstream file and the modified mux file are input to the MP4 encoding unit 280, an .mp4 bitstream file 290 is generated. The mp4 bitstream file 290 is visualized by the MPEG-4 player.

In this disclosure, the present invention has been described with respect to 3D graphics data, but the present invention is applicable to compression of 2D graphics data.

The present invention can be embodied as a computer readable code in a computer readable medium. Here, the computer may be any apparatus that can process information, and the computer readable medium may be any recording apparatus capable of storing data that is read by a computer system, e.g., a read-only memory (ROM), a random access memory (RAM), a compact disc (CD)-ROM, a magnetic tape, a floppy disk, an optical data storage device, and so on.

A method and system for making an input file using meta representation of compression of 3D graphics data according to the present invention allows an author to easily write or compress 3D graphics data and make an input file input to an MPEG-4 encoding unit using the meta representation during authoring of 3D contents, regardless of whether an input file contains an already compressed bitstream, or an uncompressed bitstream and encoding parameters.

According to the present invention, since the author can compress 3D graphics data during authoring of 3D contents, it is possible to visualize the 3D graphics data or animation data in real time even at a low network bandwidth. Further, it is possible to manufacture various types of 3D graphics data.

While this invention has been particularly shown and described with reference to exemplary embodiments thereof, it will be understood by those skilled in the art that various changes in form and details may be made therein without departing from the spirit and scope of the invention as defined by the appended claims and equivalents thereof.

What is claimed is:

1. A method of making an input file using meta representation of compression of graphics data, comprising:

(a) preparing an extensible MPEG-4 textual format (XMT) schema, wherein the XMT schema defines a compression node (BitWrapper node) containing information regarding the object data that is to be compressed, encoding parameters for compressing the object data, BitWrapperEncodingHints including a format of a compressed bitstream, and AFXConfig specifying the type of decoders available for decoding a transmitted bitstream;

(b) preparing an XMT2BIFS style sheet supporting conversion of an input XMT file into a scene file according to the XMT schema, and an XMT2MUX style sheet supporting conversion of the input XMT file into a mux file according to the XMT schema;

(c) making a scene file and a mux file by parsing the input XMT file according to the XMT schema using the XMT2BIFS and XMT2MUX style sheets;

(d) determining whether the scene file obtained as the result of parsing contains uncompressed graphics object data;

(e) when it is determined that the uncompressed graphics object data is present, sending the uncompressed graphics object data to an animation framework extension (AFX) encoder unit, storing object data and values of encoding parameters required for data compression by operation of an AFX parser in the AFX encoder unit, compressing the uncompressed graphics object data into a compressed bitstream and generating a modified scene file and a modified mux file, and using encoding parameters included in the scene file; and (f) transmitting the compressed bitstream to a decoder available for decoding the transmitted bitstream.

2. The method of claim 1, wherein the compression node comprises:

a node field containing object data that is to be compressed;

a buffer field which is not compatible with an URL field and which is used to transmit a compressed bitstream in the compression node through an in-band bitstream;

an URL field which is not compatible with the buffer field and which is used to transmit the compressed bitstream in the compression node through an out-band bitstream; and a type field defining compression method of the object data contained in the node field.

3. The method of claim 2, wherein during the transmission of the compressed bitstream through the in-band bitstream, the input XMT file containing the compression node is converted into the scene file, the scene file is input to a binary format of scene (BIFS) encoding unit and converted into a bifs file, the compressed bitstream in the node field of the compression node is included in the bifs file, and the bifs file is transmitted, and during the transmission of the compressed bitstream through the out-band bitstream, the input XMT file which contains the compression node is converted into the scene file, the scene file is input to the BIFS encoding unit and converted into the bifs file, the compressed bitstream in the node field of the compression node is transmitted separately from the bifs file.

4. The method of claim 2, wherein the AFXConfig further comprises information regarding the type of a decoder available for decoding the compressed bitstream of the object data in the node field that is compressed in the compression node by an AFX encoding unit and transmitted to a URL.

5. The method of claim 1, wherein in order to compress object data included in a node field of the compression node, the encoding parameters comprise at least one of a group of parameters related to keyframe animation data of coordinates of a fixed point of an object whose data is to be compressed, a group of parameters related to three-dimensional mesh information, a group of parameters related to rotation keyframe animation data, and a group of parameters being related to motion keyframe animation data.

6. The method of claim 1, wherein the BitWrapperEncodingHints is included in an objectDescriptor with binary identification that is equivalent to URL identification defined in an URL field in the compression node, and further specifies a name of a file storing the compressed bitstream and the type of format in which the compressed bitstream is compressed.

7. The method of claim 1, wherein (c) comprises:
receiving the input XMT file containing a header having an InitialObjectDescriptor and a body having at least one compression node; and
making the scene file and the mux file by parsing the input XMT file according to the XMT schema using the XMT2BIFS and XMT2MUX style sheets,
wherein the InitialObjectDescriptor of the header comprises:
StreamSource defining a name of a file output from a binary format of scene (BIFS) encoding unit, and
synchronization information regarding a time sequence in which graphics objects are displayed,
the compression node of the body comprises:
a node field storing a name of an already compressed node, and
a buffer field storing a name of an already compressed object data file,
the scene file comprises at least one compression node that is equivalent to the compression node of the body, and
the mux file comprises an InitialObjectDescriptor that is equivalent to the InitialObjectDescriptor of the header and information regarding a stream format of a file which is included in the InitialObjectDescriptor and output from the BIFS encoding unit.

8. The method of claim 1, wherein (c) comprises:
receiving the input XMT file having a header which includes an InitialObjectDescriptor and having a body which includes at least one compression node and an ObjectDescriptorUpdate with at least one objectDescriptor; and
making the scene file and the mux file by parsing the input XMT file according to the XMT schema using the XMT schema and the XMT2BIFS and XMT2MUX style sheets, wherein
the InitialObjectDescriptor of the header comprises:
StreamSource defining a name of a file output from a binary format of scene (BIFS) encoding unit,
decoding information regarding decoding of the compressed file from the BIFS encoding unit, and
synchronization information regarding a time sequence in which graphics objects are displayed,
the compression node of the body comprises URL identification that is equivalent to those of ObjectDescriptor of ObjectDescriptorUpdate including BitWrapperEncodingHints that contains a name of a file in which the bitstream of the already compressed object data will be stored,
the objectDescriptor in the ObjectDescriptorUpdate of the body comprises:
binary identification, as a field, which is equal to a value of the URL identification of the compression node in the body, and
AFXConfig being information regarding decoding of the compressed object data,
BitWrapperEncodingHints defines a name of a file storing the bitstream of the compressed object data and type of compression format of the compressed bitstream,
the scene file comprises at least one compression node that is equivalent to those of the body and an ObjectDescriptorUpdate that has ObjectDescriptor containing URL identification that is equivalent to those of ObjectDescriptor of ObjectDescriptorUpdate in the body and mux file that stores bitstream file in the BitWrapperEncoding Hints of ObjectDescriptor of ObjectDescriptorUpdate in the body, and
the mux file comprises an InitialObjectDescriptor and an objectDescriptor that is equivalent to those of ObjectDescriptorUpdate in the body.

9. The method of claim 1, wherein (c) comprises:
receiving the input XMT file having a header with an InitialObjectDescriptor and having a body with at least one compression node; and
making the scene file and the mux file by parsing the input XMT file according to the XMT schema using the XMT schema and the XMT2BITS and XMT2MUX style sheets, wherein
the InitialObjectDescriptor of the header comprises:
StreamSource defining a name of a file output from a binary format of scene (BIFS) encoding unit, and
synchronization information regarding a time sequence in which graphics objects are displayed,
the compression node of the body comprises:
a node field storing a name of a node that is to be compressed,
object data that is included in the node field and to be compressed,
encoding parameters available for compressing the object data, and
a buffer field storing a name of a bitstream file of the object data compressed using the encoding parameters,
the scene file comprises at least one compression node that is equivalent to the compression node of the body,
the mux file comprises an InitialObjectDescriptor that is equivalent to the InitialObjectDescriptor of the header and information regarding a stream format of a file that is output from the BIFS encoding unit and included in the InitialObjectDescriptor.

10. The method of claim 1, wherein (c) comprises:
receiving the input XMT file having a header that includes an InitialObjectDescriptor; and
making the scene file and the mux file by parsing the input XMT file according to the XMT schema using the XMT schema and the XMT2BIFS and XMT2MUX style sheets,
wherein the InitialObjectDescriptor of the header comprises:
StreamSource defining a name of a file output from a binary format of scene (BIFS) encoding unit,
decoding information regarding decoding of the compressed file from the BIFS encoding unit, and
synchronization information regarding a time sequence in which graphics objects are displayed,
the compression node of the body comprises:
a node field storing a name of a node that is to be compressed;
object data that is included in the node field and to be compressed;
encoding parameters available for compressing the object data, and a field storing URL identification that is equivalent to those of ObjectDescriptor of ObjectDescriptorUpdate including BitWrapperEncodingHints that contains a name of a file in which the bitstream of the object data compressed using the encoding parameters will be stored, the objectDescriptor included in the ObjectDescriptorUpdate of the body comprises:
  binary identification, as a field, which is equal to a value of the URL identification of the compression node in the body, and
  AFXConfig being information regarding decoding of the compressed object data and BitWrapperEncodingHints defining a name of a file storing the bitstream of the compressed object data and stream format of the bitstream, the scene file comprises:
  at least one compression node that is equivalent to those of the body, and
  an ObjectDescriptorUpdate that has ObjectDescriptor containing URL identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file comprises an InitialObjectDescriptor and an objectDescriptor that are equivalent to those of ObjectDescriptorUpdate in the body.

11. The method of claim 1, wherein (c) comprises:

receiving the input XMT file having a header that includes an InitialObjectDescriptor and having a body that includes at least one compression node with a buffer field, at least one compression node with an URL field, and an ObjectDescriptorUpdate with objectDescriptors, the number of which is equal to the number of the compression nodes with the URL field; and making the scene file and the mux file by parsing the input XMT file according to the XMT schema using the XMT schema and the XMT2BIFS and XMT2MUX style sheets, wherein the InitialObjectDescriptor of the header comprises:
  StreamSource defining a name of a file output from a binary format of scene (BIFS) encoding unit,
  decoding information regarding decoding of the compressed file from the BIFS encoding unit, and
  synchronization information regarding a time sequence in which graphics objects are displayed, the compression node of the body that has the buffer field comprises:
  a node field storing a name of a node that is to be compressed;
  object data that is included in the node field and to be compressed;
  encoding parameters available for compressing the object data; and
  a buffer field storing a name of a bitstream of the object data compressed using the encoding parameters, the compression node of the body that has the URL field comprises:
  a node field storing a name of a node that is to be compressed,
  object data that is included in the node field and to be compressed;
  encoding parameters available for compressing the object data; and
  a field storing URL identification that is equivalent to those of ObjectDescriptor of ObjectDescriptorUpdate including BitWrapperEncodingHints that contains a name of a file in which the bitstream of the object data compressed using the encoding parameters will be stored, the objectDescriptor included in the ObjectDescriptorUpdate of the body comprises:
  binary identification, as a field, which is equal to a value of the URL identification of compression node in the body,
  AFXConfig being information regarding decoding of the compressed object data, and
  BitWrapperEncodingHints defining a name of a file storing the bitstream of the compressed object data and type of compression format of the compressed bitstream, the scene file comprises a compression node that is equivalent to those of the body, and ObjectDescriptorUpdate that has ObjectDescriptor containing URL identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file comprises InitialObjectDescriptor and objectDescriptor that are equivalent to those of ObjectDescriptorUpdate in the body.

12. The method of claim 9, wherein (d) comprises:

detecting at least one BitWrapper node from the scene file obtained by the result of parsing; and when graphics object data is included in a node field of the detected compression node, determining that uncompressed data is present.

13. The method of claim 10, wherein (d) comprises:

detecting at least one BitWrapper node from the scene file obtained by the result of parsing; and when graphics object data is included in a node field of the detected compression node, determining that uncompressed data is present.

14. The method of claim 11, wherein (d) comprises:

detecting at least one BitWrapper node from the scene file obtained by the result of parsing; and when graphics object data is included in a node field of the detected compression node, determining that uncompressed data is present.

15. The method of claim 12, wherein (e) comprises:

(e1) when it is determined that the graphics object data contains uncompressed data, compressing object data in the respective compression nodes of the scene file into bitstream by an encoding unit available for compressing the object data, using encoding parameters included in the compression nodes; and (e2) making a modified scene file by deleting the object data and encoding parameters from the respective compression nodes of the scene file, and a modified mux file modified such that a name of a file output from the BIFS encoding unit can reflect a name of the modified scene file.

16. The method of claim 15, wherein (e1) comprises:

(e11) when it is determined that the graphics object data is not compressed, storing the object data and encoding parameters in the compression node of the scene file;

(e12) transmitting the object data and encoding parameters to a predetermined encoding unit that corresponds to the type of the graphics object data in the node field of the compression node containing the stored object data; and (e13) compressing the graphics object data into a bitstream by the predetermined encoding unit using the encoding parameters.

17. The method of claim 15, wherein the predetermined encoding unit in (e1) comprises at least one of a fixed coordinate encoder, a mesh encoder, a rotational data encoder, and a positional data encoder,
wherein the fixed coordinate encoder encodes keyframe animation data regarding coordinates of a fixed point of the graphics object data that will be compressed using related parameters,
the mesh encoder encodes the three-dimensional mesh information using parameters related to the three-dimensional mesh information,
the rotational data encoder encodes rotational key frame animation data using related parameters, and
the positional data encoder encodes keyframe animation data using related parameters.

18. The method of claim 13, wherein (e) comprises:
(e1) when it is determined that the graphics object data contains uncompressed data, compressing object data in the respective compression nodes of the scene file into bitstream by an encoding unit available for compressing the object data, using encoding parameters included in the compression nodes; and
(e2) making a modified scene file by deleting the object data and encoding parameters from the respective compression nodes of the scene file, and a modified mux file modified such that a name of a file output from the BIFS encoding unit can reflect a name of the modified scene file.

19. The method of claim 14, wherein (e) comprises:
(e1) when it is determined that the graphics object data contains uncompressed data, compressing object data in the respective compression nodes of the scene file into bitstream by an encoding unit available for compressing the object data, using encoding parameters included in the compression nodes; and
(e2) making a modified scene file by deleting the object data and encoding parameters from the respective compression nodes of the scene file, and a modified mux file modified such that a name of a file output from the BIFS encoding unit can reflect a name of the modified scene file.

20. A computer readable recording medium for storing a program that executes a method of claim 1 using a computer.

21. A system for making an input file using meta representation of compression of graphics data, comprising:
an extensible MPEG-4 textual format (XMT) schema for defining a compression node that specifies graphics object data that will be compressed, encoding parameters available for compressing the graphics object data, BitWrapperEncodingHints that specifies a compression bitstream format, and AFXConfig that specifies the type of a decoder for decoding a transmitted bitstream;
an XMT2BIFS style sheet for supporting conversion of an input XMT file into a scene file using the XMT schema;
an XMT2MUX style sheet for supporting conversion of the input XMT file into a mux file using the XMT schema;
an XMT parser for making the scene file and the mux file by parsing the input XMT file according to the XMT schema using the XMT schema and the XMT2BIFS and XMT2MUX style sheets;
a compression determination unit for determining whether the scene file obtained by the parsing of the XMT parser contains uncompressed graphics object data; and
an animation framework extensions (AFX) encoder for storing object data and values of encoding parameters required for data compression by operation of an AFX parser in the AFX encoder, for compressing the graphics object data into a bitstream using the encoding parameters in the scene file and for generating a modified scene file and a modified mux file using the XMT2BIFS and the XMT2MUX when the compression determination unit determines that the graphics object data is not compressed.

22. The system of claim 21, wherein the compression node comprises:
a node field containing a graphics object data that will be compressed;
a buffer field which is which is not compatible with an URL field, wherein the system transmits a compressed bitstream in the compression node as an in-band bitstream; and
the URL field which is which is not compatible with the buffer field, wherein the system transmits the compressed bitstream in the compression node as an out-band bitstream; and
a type field which allows selection of a method of compression in which the graphics object data included in the node field is to be compressed.

23. The system of claim 22, wherein during the transmission of the compressed bitstream through the in-band bitstream, the input XMT file that includes the compression node is converted into the scene file, the scene file is input to a binary format of scene (BIFS) encoding unit and converted into a bifs file, the compressed bitstream in the node field of the compression node is inserted into the bifs file, and the bifs file is transmitted, and
during the transmission of the compressed bitstream through the out-band bitstream, the input XMT file that includes the compression node is converted into the scene file, the scene file is input to the BIFS encoding unit and converted into a bifs file, and the compressed bitstream in the node field of the compression node is individually transmitted, separated from the bifs file.

24. The method of claim 21, wherein in order to compress object data included in a node field of the compression node, the encoding parameters comprise at least one of a group of parameters related to keyframe animation data of coordinates of a fixed point of an object whose data is to be compressed, a group of parameters related to three-dimensional mesh information, a group of parameters related to rotation keyframe animation data, and a group of parameters being related to motion keyframe animation data.

25. The system of claim 21, wherein the BitWrapperEncodingHints is included in objectDescriptor with binary identification that is equivalent to URL identification defined by a URL field in the compression node, and further specifies a name of a file containing the compressed bitstream and a type of compression format of the compressed bitstream is compressed.

26. The system of claim 21, wherein the AFXConfig further specifies a type of a decoder for decoding a bitstream that is compressed from the graphics object data in the node field of the compression node by the AFX encoder and transmitted to a URL.

27. The system of claim 21, wherein the input XMT file input to the XMT parser comprises:
a header defining an InitialObjectDescriptor, and
a body defining at least one compression node,
wherein the InitialObjectDescriptor of the header comprises StreamSource for defining a name of a file output from a binary format of scene (BIFS) encoding unit, decoding information regarding decoding of the compressed file from BIFS encoding unit, and synchronization information regarding a time sequence in which graphics objects are displayed, the compression node of the body comprises:
a node field storing a name of an already compressed node, and
a buffer field storing a name of already compressed graphics object data, the scene file comprises at least one compression node that is equivalent to the compression node of the body, and the mux file comprises an InitialObjectDescriptor that is equivalent to the InitialObjectDescriptor of the header, and information regarding a stream format of a file included in the InitialObjectDescriptor and output from the BIFS encoding unit.

28. The system of claim 21, wherein the input XMT file input to the XMT parser comprises a header and a body,
wherein the header comprises an InitialObjectDescriptor, and
the body comprises:
at least one compression node, and
an ObjectDescriptorUpdate that includes at least one objectDescriptor,
wherein the InitialObjectDescriptor of the header comprises:
StreamSource defining a name of a file output from a binary format of scene (BIFS) encoding unit,
decoding information regarding decoding of the compressed file from the BIFS encoding unit, and
synchronization information regarding a time sequence in graphics objects are displayed,
the compression node of the body comprises URL identification that is equivalent to those of ObjectDescriptor of ObjectDescriptorUpdate including BitWrapperEncodingHints that contains a name of a file storing a bitstream of the already compressed graphics object data,
the objectDescriptor in the ObjectDescriptorUpdate of the body comprises:
binary identification, as a field, which has the same value as the URL ID of compression node in the body,
AFXConfig being information regarding decoding of the compressed object data, and
BitWrapperEncodingHints for defining a name of a file storing the bitstream of the compressed object data and type of compression format of the compressed bitstream,
the scene file comprises:
at least one compression node that is equivalent to those of the body, and
an ObjectDescriptorUpdate that has ObjectDescriptor containing URL identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and
the mux file comprises an InitialObjectDescriptor and an objectDescriptor that are equivalent to those of ObjectDescriptorUpdate in the body.

29. The system of claim 21, wherein the input XMT file input to the XMT parser comprises:
a header which includes an InitialObjectDescriptor, and
a body which includes at least one compression node,
wherein the InitialObjectDescriptor of the header comprises:
StreamSource for defining a name of a file output from a binary format of scene (BIFS) encoding unit,
decoding information regarding decoding of the compressed file from the BIFS encoding unit, and
synchronization information regarding a time sequence in which graphics objects are displayed,
the compression node of the body comprises:
a node field for storing a name of a node that will be compressed,
object data in the node field of the compression node that will be compressed,
encoding parameters available for compressing the object data, and
a buffer field for storing a name of a bitstream file of the object data compressed using the encoding parameters,
the scene file comprises at least one compression node that is equivalent to that of the body, and
the mux file comprises:
an InitialObjectDescriptor that is equivalent to that of the header, and
stream format information regarding a file that is included in the InitialObjectDescriptor and output from the BIFS encoding unit.

30. The system of claim 21, wherein the input XMT file input to the XMT parser comprises a header and a body,
wherein the header comprises an InitialObjectDescriptor,
the body comprises:
at least one compression node, and
an ObjectDescriptorUpdate that includes at least one objectDescriptor,
wherein the InitialObjectDescriptor of the header comprises:
StreamSource for specifying a name of a file output from a binary format of scene (BIFS) encoding unit,
decoding information regarding decoding of the compressed file from the BIFS encoding unit, and
synchronization information regarding a time sequence in which graphics objects are displayed,
the compression node of the body comprises:
a node field for storing a name of a node that will be compressed,
object data in the node field of the compression node that will be compressed,
encoding parameters available for compressing the object data, and
a field storing URL identification that is equivalent to those of ObjectDescriptor of ObjectDescriptorUpdate including BitWrapperEncodingHints that contains a name of a file in which the bitstream of the object data compressed using the encoding parameters will be stored,
the objectDescriptor of the ObjectDescriptorUpdate of the body comprises:
binary identification as a field which is equal to a value of the URL identification of compression node in the body,
AFXConfig being information regarding decoding of the compressed object data, and
BitWrapperEncodingHints for defining a name of a file storing the bitstream of the compressed object data and stream format of the bitstream,
the scene file comprises at least one compression node that is equivalent to the compression node of the body,
ObjectDescriptorUpdate that has ObjectDescriptor containing URL identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file comprises an InitialObjectDescriptor and an objectDescriptor that are equivalent to those of ObjectDescriptorUpdate in the body.

31. The system of claim 21, wherein the input XMT file input to the XMT parser comprises a header and a body, wherein the header comprises an InitialObjectDescriptor, and the body comprises:
- at least one compression node with a buffer field,
- at least one compression node with a URL field, and
- an ObjectDescriptorUpdate that includes objectDescriptors, the number of which is equal to the number of compression nodes that included in the URL field, wherein the InitialObjectDescriptor of the header comprises:
- StreamSource for specifying a name of a file output from a binary format of scene (BIFS) encoding unit,
- decoding information regarding decoding of the compressed file from the BIFS encoding unit, and
- synchronization information regarding a time sequence in which graphics objects are displayed, the compression node of the body that has the buffer field comprises:
- a node field for storing a name of a node that will be compressed,
- object data in the node field of the compression node that will be compressed,
- encoding parameters available for compressing the object data, and
- a buffer field storing a name of a bitstream file of object data compressed using the encoding parameters, the compression node of the body that has the URL field comprises:
- a node field storing a name of a node that will be compressed,
- object data in the node field of the compression node that will be compressed,
- encoding parameters available for compressing the object data, and
- a field for storing URL identification that is equivalent to those of ObjectDescriptor of ObjectDescriptorUpdate including BitWrapperEncodingHints that contains the name of a file in which a bitstream of object data compressed using the encoding parameters will be stored, the objectDescriptor included in the ObjectDescriptorUpdate of the body comprises:
- binary identification, as a field, which has the same value as the URL identification of compression node in the body, and
- AFXConfig being information regarding decoding of the compressed object data, and
- BitWrapperEncodingHints for defining a name of a file storing the bitstream of the compressed object data and type of compression format of the compressed bitstream, the scene file comprises a compression node that is equivalent to those of the body, and ObjectDescriptorUpdate that has ObjectDescriptor containing URL identification that is equivalent to those of ObjectDescriptor of ObjectDescriptorUpdate in the body and mux file that stores bitstream file in the BitWrapperEncodingHints of ObjectDescriptor of ObjectDescriptorUpdate in the body, and the mux file comprises an InitialObjectDescriptor and an objectDescriptor that are equivalent to those of ObjectDescriptorUpdate in the body.

32. The system of claim 29, wherein the compression determination unit comprises:
- a compression node detector for detecting at least one BitWrapper node from the scene file obtained by the result of parsing; and
- a compression data determination unit for determining that uncompressed object data is present when a node field of the detected BitWrapper node contains graphics object data.

33. The system claim 30, wherein the compression determination unit comprises:
- a compression node detector for detecting at least one BitWrapper node from the scene file obtained by the result of parsing; and
- a compression data determination unit for determining that uncompressed object data is present when a node field of the detected BitWrapper node contains graphics object data.

34. The system of claim 31, wherein the compression determination unit comprises:
- a compression node detector for detecting at least one BitWrapper node from the scene file obtained by the result of parsing; and
- a compression data determination unit for determining that uncompressed object data is present when a node field of the detected BitWrapper node contains graphics object data.

35. The system of claim 32, wherein the AFX encoding unit comprises:
- an object data storage unit for storing the object data;
- an encoding parameter storage unit for storing the encoding parameters;
- the AFX parser for detecting at least one compression node from the scene file that includes the BitWrapper node, and having object data and encoding parameters in the compression node of the scene file stored in the object data storage unit and the encoding parameter storage unit when graphics object data is included in a node field of the compression node;
- an encoding unit for matching the type of graphics object data in the node field of the compression node, and compressing the object data in the object data storage unit into a bitstream, using the encoding parameters stored in the encoding parameter storage unit; and
- an input file generator for generating a modified scene file by deleting the object data and encoding parameters from the scene file, and a modified mux file modified such that a name of a file output from the BIFS encoding unit reflects a name of the modified scene file, when the AFX parser determines that graphics object data is present in the node field of the compression node.

36. The system of claim 33, wherein the AFX encoding unit comprises:
- an object data storage unit for storing the object data;
- an encoding parameter storage unit for storing the encoding parameters;
- the AFX parser for detecting at least one compression node from the scene file that includes the BitWrapper node, and having object data and encoding parameters in the compression node of the scene file stored in the object data storage unit and the encoding parameter storage unit when graphics object data is included in a node field of the compression node;

an encoding unit for matching the type of graphics object data in the node field of the compression node, and compressing the object data in the object data storage unit into a bitstream, using the encoding parameters stored in the encoding parameter storage unit; and an input file generator for generating a modified scene file by deleting the object data and encoding parameters from the scene file, and a modified mux file modified such that a name of a file output from the BIFS encoding unit reflects a name of the modified scene file, when the AFX parser determines that graphics object data is present in the node field of the compression node.

37. The system of claim 34, wherein the AFX encoding unit comprises:

an object data storage unit storing the object data;

an encoding parameter storage unit for storing the encoding parameters;

the AFX parser for detecting at least one compression node from the scene file that includes the BitWrapper node, and having object data and encoding parameters in the compression node of the scene file stored in the object data storage unit and the encoding parameter storage unit when graphics object data is included in a node field of the compression node;

an encoding unit for matching the type of graphics object data in the node field of the compression node, and compressing the object data in the object data storage unit into a bitstream, using the encoding parameters stored in the encoding parameter storage unit; and an input file generator for generating a modified scene file by deleting the object data and encoding parameters from the scene file, and a modified mux file modified such that a name of a file output from the BIFS encoding unit reflects a name of the modified scene file, when the AFX parser determines that graphics object data is present in the node field of the compression node.

38. The system of claim 37, wherein the encoding unit comprises at least one of a fixed coordinate encoder, a mesh encoder, a rotational data encoder, and a positional data encoder, wherein the fixed coordinate encoder matches the type of the stored object data and encoding parameters and encodes keyframe animation data (CoordinateInterpolator data) regarding coordinates of a fixed point of object data that will be compressed using related parameters;

the mesh encoder matches the type of the stored object data and encoding parameters and encodes three-dimensional mesh information using parameters regarding the three-dimensional mesh information;

the rotational data encoder matches the type of the stored object data and encoding parameters and encodes rotational keyframe animation data (OrientationInterpolator data) using related parameters; and the positional data encoder matches the type of the stored object data and encoding parameters and encodes motion keyframe animation data (PositionInterpolator data) using related parameters.

39. An animation framework extensions (AFX) encoding apparatus comprising:

an AFX parser for detecting at least one compression node from a scene file that includes a BitWrapper node, and storing a node containing object data and encoding parameters of the compression node of the scene file when a node field of the compression node contains graphics object data;

an object data storage unit for storing the object data stored by the AFX parser;

an encoding parameter storage unit for storing the encoding parameters stored by the AFX parser;

an encoding unit for matching the type of the stored object data and compressing the original data in the object data storage unit into a bitstream using the encoding parameters stored in the encoding parameter storage unit; and an input file generator for generating a modified scene file by deleting object data and encoding parameters from respective compression nodes of the scene file and a modified mux file modified such that a name of a file output from a BIFS encoding unit reflects a name of the modified scene file, when the AFX parser determines that the node field of the compression node contains graphics object data.

40. The apparatus of claim 39, wherein the encoding unit comprises at least one of a fixed coordinate encoder, a mesh encoder, a rotational data encoder, and a positional data encoder, wherein the fixed coordinate encoder matches the type of the stored object data and encoding parameters, and encodes keyframe animation data (CoordinateInterpolator data) regarding coordinates of a fixed point of object data that will be compressed using related parameters;

the mesh encoder matches the type of stored object data and encoding parameters and encodes three-dimensional mesh information using related parameters;

the rotational data encoder matches the type of the stored object data and encoding parameters and encodes rotational keyframe animation data (OrientationInterpolator data) using related parameters; and the positional data encoder matches the type of the stored object data and encoding parameters and encodes motion keyframe animation data (PositionInterpolator data) using related parameters.

41. An animation framework extensions (AFX) encoding method comprising:

(a) detecting at least one compression node from a scene file that includes a BitWrapper node, wherein the detected compression node includes encoding parameters required for data compression and object data to be compressed;

(b) storing the object data and encoding parameters included in the detected compression node;

(c) compressing the object data into a bitstream by an encoding unit matching the type of the compression node that contains the object data, using the stored encoding parameters matching the encoding unit;

(d) generating a modified scene file by deleting the object data and encoding parameters from each of the detected compression nodes of the scene file, and generating a modified mux file modified such that a name of a file output from a a binary format of scene (BIFS) encoding unit reflects a name of the modified scene file; and (e) transmitting the compressed bitstream to a decoder.

42. The method of claim 41, wherein the encoding unit used in (c) comprises at least one of a fixed coordinate encoder, a mesh encoder, a rotational data encoder, and a positional data encoder, wherein the fixed coordinate encoder matches the type of the stored object data and encoding parameters and encodes keyframe animation data (CoordinateInterpolator data) regarding coordinates of a fixed point of object that will be compressed using related parameters;

the mesh encoder matches the type of the stored object data and encoding parameters and encodes three-dimensional mesh information using related parameters;

the rotational data encoder matches the type of the stored object data and encoding parameters and encodes rotational keyframe animation data (OrientationInterpolator data) using related parameters; and the positional data encoder matches the type of the stored object data and encoding parameters and encodes motion keyframe animation data (PositionInterpolator data) using related parameters.

43. A computer readable recording medium for storing a program that executes a method of claim 41 using a computer.

44. A computer readable recording medium for storing a program that executes a method of claim 42 using a computer.

45. A method of making an input file using meta representation of compression of graphics data, comprising:
(a) preparing an extensible MPEG-4 textual format (XMT) schema,
wherein the XMT schema defines a compression node (BitWrapper node) containing information regarding the object data that is to be compressed, encoding parameters for compressing the object data, BitWrapperEncodingHints including a format of a compressed bitstream, and AFXConfig specifying the type of decoders available for decoding a transmitted bitstream;
(b) preparing an XMT2BIFS style sheet supporting conversion of an input XMT file into a scene file according to the XMT schema, and an XMT2MUX style sheet supporting conversion of the input XMT file into a mux file according to the XMT schema;
(c) making a scene file and a mux file by parsing the input XMT file according to the XMT schema using the XMT2BIFS and XMT2MUX style sheets;
(d) determining whether the scene file obtained as the result of parsing contains uncompressed graphics object data;
(e) when it is determined that the uncompressed graphics object data is not present, outputting the scene file and the mux file as an input file of an MPEG-4 encoder; and
(f) when it is determined that the uncompressed graphics object data is present, sending the uncompressed graphics object data to an animation framework extension (AFX) encoder unit, storing object data and values of encoding parameters required for data compression by operation of an AFX parser in the AFX encoder unit, compressing the uncompressed graphics object data into a compressed bitstream, generating a modified scene file and a modified mux file, using encoding parameters included in the scene, and outputting the compressed bitstream, the modified scene and the modified mux file as an input file of the MPEG-4 encoder.

* * * * *